(12) United States Patent
Johansson

(10) Patent No.: US 8,825,415 B2
(45) Date of Patent: Sep. 2, 2014

(54) METHODS AND APPARATUSES FOR ESTIMATION AND COMPENSATION ON NONLINEARITY ERRORS

(75) Inventor: Håkan Johansson, Linköping (SE)

(73) Assignee: Signal Processing Devices Sweden AB, Linkoping (SE)

( * ) Notice: Subject to any disclaimer, the term of this patent is extended or adjusted under 35 U.S.C. 154(b) by 575 days.

(21) Appl. No.: 12/998,896

(22) PCT Filed: Dec. 16, 2008

(86) PCT No.: PCT/EP2008/067663

§ 371 (c)(1),
(2), (4) Date: Jul. 19, 2011

(87) PCT Pub. No.: WO2010/069365

PCT Pub. Date: Jun. 24, 2010

(65) Prior Publication Data

US 2011/0276284 A1   Nov. 10, 2011

(51) Int. Cl.
*G06F 19/00* (2011.01)
*H03M 1/06* (2006.01)

(52) U.S. Cl.
CPC .................... *H03M 1/0626* (2013.01)
USPC ............................................ 702/58; 341/118

(58) Field of Classification Search
CPC ............. G06F 19/00; G06F 5/00; G06F 7/00; G06F 17/10; G06F 11/07; H03M 1/06; H03M 1/00; H03M 1/1235; H03M 1/124; H03M 1/10; H03M 1/1009; H03M 13/00; H04K 1/10; H03F 1/26; H04L 27/00; H03H 11/16
USPC ............................................ 702/58; 341/118
See application file for complete search history.

(56) References Cited

U.S. PATENT DOCUMENTS 5,568,142 A * 10/1996 Velazquez et al. ............ 341/126
6,570,514 B1    5/2003 Velazquez (Continued)

FOREIGN PATENT DOCUMENTS

| EP | 1569335 A1 | 8/2005 |
|---|---|---|
| WO | WO-0229806 A1 | 4/2002 |

OTHER PUBLICATIONS

R. Crochiere, et al., "Interpolation and decimation of digital signals", 1981 IEEE.*

(Continued)

*Primary Examiner* — John Breene
*Assistant Examiner* — Ruihua Zhang
(74) *Attorney, Agent, or Firm* — Harness, Dickey & Pierce, P.L.C.

(57) ABSTRACT

An estimation unit for estimating a nonlinearity error of a conversion circuit, such as an ADC, is adapted to receive a continuous-time input signal and output a digital output signal. In at least one embodiment, the continuous-time input signal is essentially bandlimited to an angular frequency band $[\omega_1, \omega_2]$, where $\omega_1 > (L-1)\pi/T$, $\omega_2 < L\pi/T$, L is a positive integer, and T is a sample period of the conversion circuit. The estimation unit includes an input port for receiving a digital input signal having a first sample rate $1/T$ and an output port for outputting a digital estimated error signal also having the first sample rate. For each integer P_k in a set of integers, the estimation unit a first linear filter unit for generating a first signal $s_1(n)$ as a linear function of the digital input signal, an interpolation unit for interpolating the first signal $s_1(n)$ to generate a second signal $s_2(m)$ having a second sample rate which is a factor L·R_k higher than the first sample rate, wherein L·R_k ≥ $\omega_2$·T·P_k/π, a nonlinearity unit for generating a third signal $s_3(m)$ as $(s_2(m))^{P\_k}$, and a second linear filter unit for generating a component of the estimated error signal based on the third signal $s_3(m)$, wherein the component has the first sample rate. Furthermore, the estimation unit includes an adder circuit for generating the estimated error signal as the sum of the components of the estimated error signal. Moreover, at least one embodiment is directed to a compensation circuit including the estimation unit, corresponding methods for estimating and compensating nonlinearity errors, a computer program product, a computer readable medium, and a hardware-description entity.

27 Claims, 9 Drawing Sheets

(56) References Cited

U.S. PATENT DOCUMENTS

| | | |
|---|---|---|
| 6,639,537 B1 | 10/2003 | Raz |
| 7,142,137 B2 | 11/2006 | Batruni |
| 7,199,736 B2 | 4/2007 | Batruni |
| 7,397,404 B2 | 7/2008 | Batruni |
| 2005/0219089 A1 | 10/2005 | Batruni |
| 2005/0286668 A1 | 12/2005 | Kubin et al. |
| 2009/0058521 A1* | 3/2009 | Fernandez .................. 330/149 |

OTHER PUBLICATIONS

J. Tsimbinos, et al., "Input Nyquist sampling suffices to identify and compensate nonlinear systems", 1998 IEEE.*

European Office Action dated Feb. 20, 2013 issued in European Application No. 08875462.7.

Chia-Chuan Hsiao, "Polyphase Filter Matrix for Rational Sampling Rate Conversions" (Apr. 6, 1987). International Conference on Acoustics, Speech and Signal Processing, vol. CONF. 12, pp. 2173-2176.

Ronald E. Crochiere, "Interpolation and Decimation of Digital Signals—A Tutorial Reveiw" (Mar. 1981). Proceedings of the IEEE, vol. 69, No. 3, pp. 300-331.

John Tsimbinos et al., "Input Nyquist Sampling Suffices to Identify and Compensate Nonlinear Systems" (Oct. 1998). IEEE Transactions on Signal Processing, vol. 46, No. 10, pp. 2833-2837.

Walter A. Frank, "Sampling Requirements for Volterra System Identification" (Sep. 1996). Signal Processing Letters, vol. 3, No. 9, pp. 266-268.

Hai-Wen Chen, "Modeling and Identification of Parallel Nonlinear Systems: Structural Classification and Parameter Estimation Methods" (Jan. 1995). Proceedings of the IEEE, vol. 83, No. 1, pp. 39-66.

* cited by examiner

METHODS AND APPARATUSES FOR
ESTIMATION AND COMPENSATION ON
NONLINEARITY ERRORS

TECHNICAL FIELD

The present invention relates to estimation and compensation of nonlinearity errors. More particularly, the present invention relates to estimation and compensation of nonlinearity errors of a conversion circuit adapted to receive a continuous-time input signal and output a digital output signal, such as an analog-to-digital converter.

BACKGROUND

Digital signal processing may be preferred over analog signal processing in many cases, e.g. due to higher accuracy, lower power consumption, and/or smaller required circuit area. In order to process an analog signal by means of digital signal processing, it has to be converted to a digital representation. This is typically done in an analog-to-digital converter (ADC), in which the analog signal is sampled at a sample rate $f_s$ to generate a discrete-time analog signal, which is then converted to a digital representation.

Due to unwanted nonlinear behavior of e.g. the ADC and/or circuitry preceding the ADC, such as amplifiers and/or filters, the signal is normally subject to nonlinear distortion. Such nonlinear distortion may e.g. be compensated for in the digital domain using digital signal processing.

To avoid aliasing, the analog signal should be bandlimited and have a bandwidth that is less than half the sampling rate. A problem is that nonlinear distortion normally tends to increase the bandwidth of a signal. Hence, even if the (undistorted) analog signal is properly bandlimited, the nonlinearly distorted signal may well have a bandwidth that is greater than half the sampling rate. A brute-force approach to circumvent this problem is to increase the sample rate of the ADC such that the sample rate is greater than twice the bandwidth of the nonlinearly distorted signal in order to properly capture the nonlinearly distorted signal and facilitate proper compensation of the nonlinear distortion in the digital domain. However, increasing the sampling rate of the ADC is undesirable e.g. in that harder requirements, e.g. in terms of speed, is set on circuit components of the ADC, such as sample-and-hold circuits and comparators.

The article W. A. Frank et al, "Sampling requirements for Volterra system identification", *IEEE Signal Processing Letters*, vol. 3, no. 9, pp. 266-268, September 1996 discloses that a sampling rate twice as high as the bandwidth of the undistorted signal suffices to correctly identify discrete Volterra kernels corresponding to continuous Volterra kernels of a nonlinear model. In the article J. Tsimbinos et al, "Input Nyquist sampling suffices to identify and compensate nonlinear systems", *IEEE Transactions on Signal Processing*, vol. 46, no. 10, pp 2833-2837, October 1998, this is utilized for sampling a distorted signal at a sampling rate of twice the bandwidth of the undistorted signal and compensating for the nonlinear distortion using an inverse Volterra model. However, the use of an inverse model of Volterra type results in a relatively high computational complexity, especially for high nonlinearity orders and/or long memory, which is a disadvantage.

SUMMARY

An object of the present invention is to provide means for estimating and compensating nonlinear distortion of circuitry, such as an analog-to-digital converter, having a continuous-time input signal and a digital output signal.

According to a first aspect, there is provided an estimation unit for estimating a nonlinearity error of a conversion circuit adapted to receive a continuous-time input signal, essentially bandlimited to an angular frequency band $[\omega_1, \omega_2]$, and output a digital output signal, where $\omega_1 > (L-1)\pi/T$, $\omega_2 < L\pi/T$, L is a positive integer, and T is a sample period of the conversion circuit. The estimation unit comprises an input port for receiving a digital input signal having a first sample rate $1/T$. The digital input signal is an approximation of the continuous-time input signal to the conversion circuit. Furthermore, the conversion circuit comprises an output port for outputting a digital estimated error signal having the first sample rate. The digital estimated error signal is an estimate of the nonlinearity error of the conversion circuit. Moreover, for each integer P_k in a set of integers, the estimation unit comprises a first linear filter unit for generating a first signal $s_1(n)$ as a linear function of the digital input signal, an interpolation unit for interpolating the first signal $s_1(n)$ to generate a second signal $s_2(m)$ having a second sample rate which is a factor $L \cdot R\_k$ higher than the first sample rate, wherein $L \cdot R\_k \geq T \cdot \omega_2 \cdot P\_k/\pi$, a nonlinearity unit for generating a third signal $s_3(m)$ as $(s_2(m))^{P\_k}$, and a second linear filter unit for generating a component of the estimated error signal based on the third signal $s_3(m)$, wherein said component has the first sample rate. In addition, the estimation unit comprises an adder circuit for generating the estimated error signal as the sum of the components of the estimated error signal.

For L=1, the first linear filter unit may be arranged to receive said digital input signal for generating the first signal $s_1(n)$.

For L≥2, the estimation unit may comprise a high-pass interpolation unit arranged to perform high-pass interpolation of the digital input signal with the factor L for generating an interpolated input signal. The first linear filter unit 100-*k* may be arranged to receive said interpolated input signal for generating the first signal $s_1(n)$.

The interpolation unit may comprise R_k computational branches. Each computational branch of the interpolation unit may comprise a polyphase component of an interpolation filter of the interpolation unit and be adapted to generate every R_k:th sample of the second signal $s_2(m)$.

The nonlinearity unit may comprise R_k computational branches, each of which may be adapted to generate every R_k:th sample of the third signal $s_3(m)$.

The second linear filter unit may comprise R_k computational branches. Each computational branch of the second linear filter unit may be adapted to receive every R_k:th sample of the third signal $s_3(m)$. Furthermore, each computational branch of the second linear filter unit may comprise a polyphase component of a filter of the second linear filter unit. Moreover, the second linear filter unit may comprise an adder circuit for generating samples of the component of the estimated error signal as the sum of samples of output signals from the polyphase components of the filter of the second linear filter unit. For L≥2, the second linear filter unit may further comprise one or more downsampler units for downsampling the output signals of the polyphase components or the output signal of the adder circuit with the factor L.

According to a second aspect, there is provided a compensation circuit for compensating nonlinearity-errors of a conversion circuit adapted to receive a continuous-time input signal and generate a digital output signal. The compensation circuit comprises an input port for receiving the digital output signal from the conversion circuit. Furthermore, the compensation circuit comprises a first subtractor unit for subtracting a first estimated error signal from the digital output signal of the conversion circuit and thereby generating a first compensated digital output signal. Moreover, the compensation circuit comprises a first estimation unit according to the first aspect, arranged to receive the digital output signal from the conversion circuit on its input port and generate the first estimated error signal on its output port.

The compensation circuit may comprise M additional estimation units according to the first aspect. For $2 \leq i \leq M+1$, the i:th estimation unit may be adapted to generate an i:th estimated error signal on its output port. Furthermore, again for $2 \leq i \leq M+1$, the compensation circuit may comprise an i:th subtractor unit for subtracting the i:th estimated error signal from the digital output signal of the conversion circuit and thereby generate an i:th compensated digital output signal. Moreover, yet again for $2 \leq i \leq M+1$, the i:th estimation unit may be arranged to receive the (i−1):th compensated digital output signal on its input port.

According to a third aspect, there is provided an electronic circuit. The electronic circuit comprises a conversion circuit adapted to receive a continuous-time input signal and generate a digital output signal. Furthermore, the electronic circuit comprises a compensation circuit according to the second aspect. The compensation circuit is arranged to receive the digital output signal of the conversion circuit on its input port. The conversion circuit may be an analog-to-digital converter.

According to a fourth aspect, an integrated circuit comprises the compensation circuit according to the second aspect.

According to a fifth aspect, an electronic apparatus comprises the compensation circuit according to the second aspect. The electronic apparatus may e.g. be, but is not limited to, a measurement equipment, a radio receiver, or a radar equipment.

According to a sixth aspect, there is provided a method of estimating a nonlinearity error of a conversion circuit adapted to receive a continuous-time input signal, essentially band-limited to an angular frequency band $[\omega_1, \omega_2]$, and output a digital output signal, where $\omega_1 > (L-1)\pi/T$, $\omega_2 < L\pi/T$, L is a positive integer, and T is a sample period of the conversion circuit. According to the method, a digital input signal having a first sample rate is received. The digital input signal is an approximation of the continuous-time input signal to the conversion circuit. Furthermore, the method comprises, for each integer P_k in a set of integers, generating a first signal $s_1(n)$ as a linear function of the digital input signal, interpolating the first signal $s_1(n)$ to generate a second signal $s_2(m)$ having a second sample rate which is a factor $L \cdot R\_k$ higher than the first sample rate, wherein $L \cdot R\_k \geq T \cdot \omega_2 \cdot P\_k/\pi$, generating a third signal $s_3(m)$ as $(s_2(m))^{P\_k}$, and generating a component of an estimated error signal based on linear filtering of the third signal $s_3(m)$, wherein said component has the first sample rate. Moreover, according to the method, the estimated error signal is generated as the sum of the components of the estimated error signal.

According to a seventh aspect, there is provided a method of compensating nonlinearity-errors of a conversion circuit adapted to receive a continuous-time input signal and generate a digital output signal. The method comprises receiving the digital output signal from the conversion circuit. Furthermore, the method comprises generating a first estimated error signal according to the method of the sixth aspect using the digital output signal of the conversion circuit as the digital input signal. Moreover, the method comprises generating a first compensated digital output signal by subtracting the first estimated error signal from the digital output signal of the conversion circuit.

The method may comprise generating M additional compensated digital output signals. For $2 \leq i \leq M+1$, an i:th estimated error signal may be generated according to the method of sixth aspect using the (i−1):th compensated output signal as the digital input signal. Furthermore, again for $2 \leq i \leq M+1$, the i:th compensated digital output signal may be generated by subtracting the i:th estimated error signal from the digital output signal of the conversion circuit.

According to an eighth aspect, there is provided a computer program product comprising computer program code means for executing the method according to the sixth or seventh aspect when said computer program code means are run by an electronic device having computer capabilities.

According to a ninth aspect, there is provided a computer readable medium having stored thereon a computer program product comprising computer program code means for executing the method according the sixth or the seventh aspect when said computer program code means are run by an electronic device having computer capabilities.

According to a tenth aspect, there is provided a hardware-description entity comprising computer-interpretable hardware-description code describing the estimation unit according to the first aspect or the compensation circuit according to the second aspect and enabling computer-aided fabrication thereof as an application-specific hardware unit, through configuration of a configurable hardware unit, or a combination thereof.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
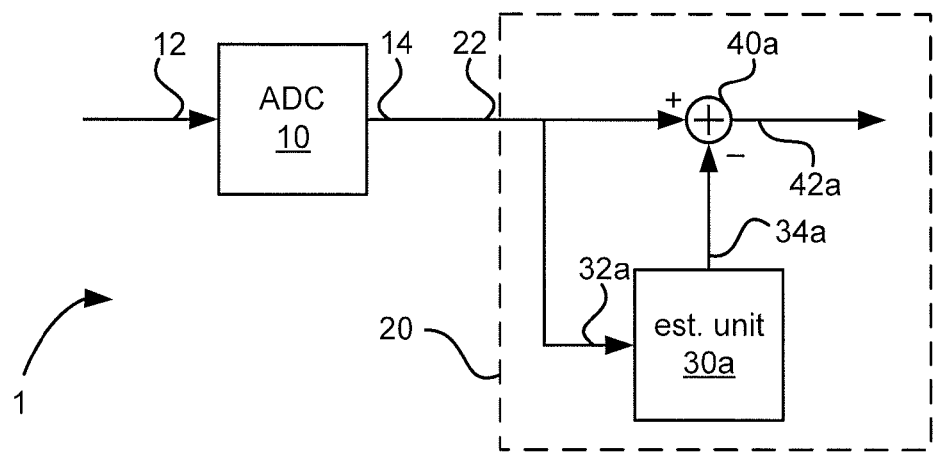
FIG. 1 is a block diagram of an electronic circuit according to an embodiment of the present invention.

FIG. 1 is a block diagram of an electronic circuit 1 according to an embodiment of the present invention. The electronic circuit 1 comprises a conversion circuit 10 adapted to receive a continuous-time input signal $x_a(t)$, where t denotes time, on an input port 12 of the conversion circuit 10 and generate a digital output signal y(n), where n is an integer-valued sequence index, of the conversion circuit 10 on an output port 14 of the conversion circuit. The conversion circuit 10 is illustrated in FIG. 1 as an analog-to-digital converter (ADC). However, the conversion circuit 10 is not limited to an ADC, but can e.g. comprise an ADC and additional components, such as but not limited to buffer amplifiers, variable-gain amplifiers (VGAs), and/or filters connected to the ADC. Both the ADC and said additional components may, in such a case, contribute to a nonlinearity error of the conversion circuit 10. In the remainder of this specification, the conversion circuit 10 will be referred to as the ADC 10 for simplicity, although this terminology should not be construed as limiting as indicated above.

Ideally, the digital output signal y(n) of the ADC 10 is equal to $x(n)=x_a(nT)$, where T is the sample period of the ADC 10 and x(n) denotes an ideal, or desired, output signal of the ADC 10. However, due to nonlinearities in the ADC 10, y(n) will deviate from x(n).

According to the embodiment illustrated in FIG. 1, the electronic circuit 1 comprises a compensation circuit for compensating nonlinearity-errors of the ADC 10. The compensation circuit 20 is arranged to receive the digital output signal of the ADC 10 on an input port 22 of the compensation circuit 20.

Furthermore, according to the embodiment illustrated in FIG. 1, the compensation circuit 20 comprises an estimation unit 30a. The estimation unit 30a has an input port 32a for receiving a digital input signal, which is a discrete-time approximation of the continuous-time input signal $x_a(t)$ of the ADC 10. The estimation unit 30a is adapted to use a model (which is further described below) of the nonlinearities of the ADC 10 to estimate the nonlinearity error in the digital output signal of the ADC 10 using the digital input signal of the estimation unit 30a as input to the model. In the embodiment illustrated in FIG. 1, the digital output signal y(n) of the ADC 10, which is a relatively good discrete-time approximation of the input signal $x_a(t)$ to the ADC 10 (i.e. a relatively good approximation of x(n)) provided that the nonlinearity errors of the ADC 10 are relatively small in comparison with the desired output signal x(n), is used as the digital input signal of the estimation unit 30a. The estimation unit 30a is adapted to generate an estimated error signal, which is an estimate of the nonlinearity error of the ADC 10, on an output port 34a of the estimation unit 30a.

Furthermore, in the embodiment illustrated in FIG. 1, the compensation circuit 20 comprises a subtractor unit 40a for subtracting the estimated error signal generated by the estimation unit 30a from the digital output signal y(n) of the ADC 10. Thereby, the subtractor unit 40a generates a compensated digital output signal $y_1(n)$, which is output on an output port 42a of the subtractor unit 40a. The compensated digital output signal $y_1(n)$ generated by the subtractor unit 40a may be an output signal of the compensation circuit 20.

Provided that model parameters of the model have been appropriately tuned to capture the nonlinearity error, and that the nonlinearity error in the digital output signal y(n) is relatively small in comparison with the desired output signal x(n), the compensated digital output signal $y_1(n)$ will be a better approximation of x(n) than y(n) is. Hence, the ADC 10 together with the compensation circuit 20 provides an ADC (with $y_1(n)$ as output signal) that has a better linearity than the ADC 10 alone. It should be noted that this is not true in a general sense for any nonlinear system. For example, if the nonlinearity error is excessively large, y(n) will be a too poor approximation of x(n) for the estimation unit 30a to be able to make a good-enough estimation of the nonlinearity error, whereby $y_1(n)$ may actually be a worse approximation of x(n) than y(n) is. The ADCs (or other conversion circuits), for which embodiments of the present invention can be applied to improve the linearity, may e.g. be determined by means of measurements and/or circuit simulations. In the remainder of this specification, it is assumed that the nonlinearities of the ADC 10 are such that $y_1(n)$ is a better approximation of x(n) than y(n).

Figure 2:
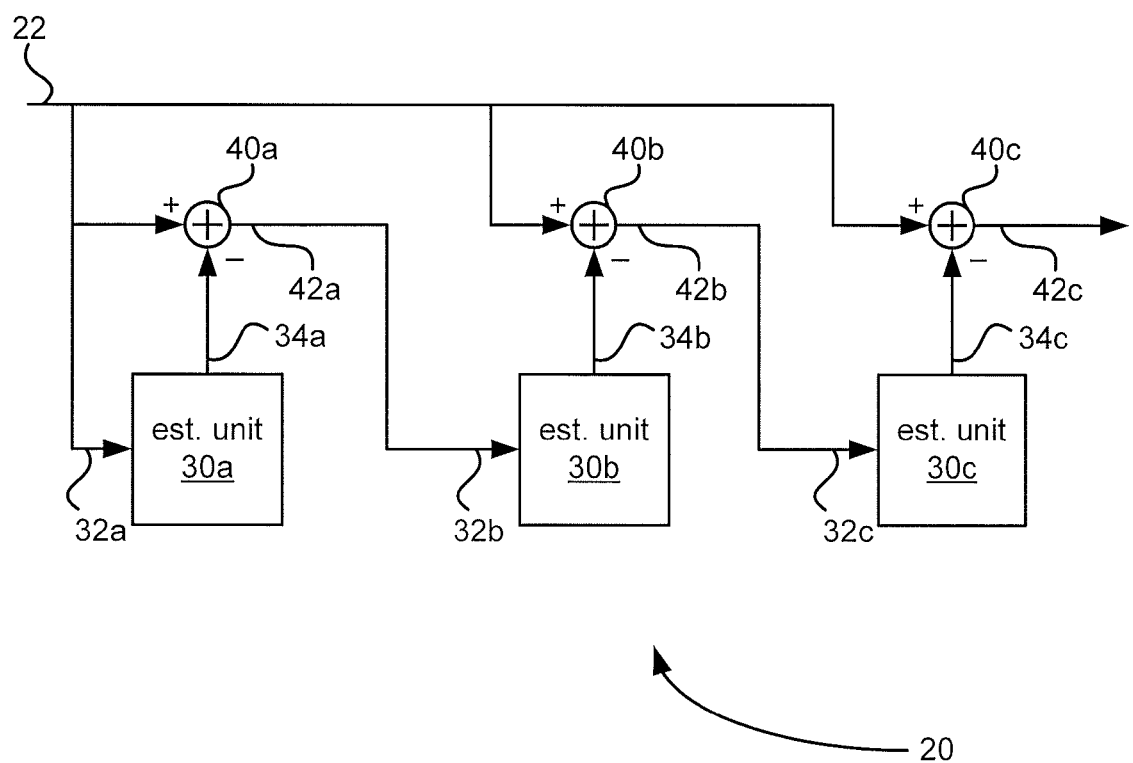
FIG. 2 is a block diagram of a compensation circuit according to an embodiment of the present invention.

According to the embodiment illustrated in FIG. 1, the compensation circuit 20 is arranged to perform the compensation of the digital output signal y(n) of the ADC 10 in a single stage. According to other embodiments, the compensation circuit 20 is arranged to perform the compensation iteratively in a plurality of stages. This is illustrated in FIG. 2, which shows a block diagram of the compensation circuit 20 according to an embodiment of the present invention. In the embodiment illustrated in FIG. 2, the compensation is performed in three stages. This is, however, only an example used for illustration. In other embodiments, any number of stages may be used for the compensation.

In addition to the estimation unit 30a and the subtractor unit 40a, which are also present in the embodiment illustrated in FIG. 1, the embodiment of the compensation circuit 20 illustrated in FIG. 2 comprises two additional estimation units 30b and c, and two additional subtractor units 40b and c. In the following, the estimation units 30a, b, and c are referred to as the first, second, and third estimation unit, respectively. Similarly, the subtractor units 40a, b, and c are referred to as a first, second, and third subtractor unit, respectively. The estimated error signal generated on the output port 34a of the first estimation unit 30a is referred to as a first estimated error signal, and the compensated digital output signal $y_1(n)$ generated on the output port 42a of the first subtractor unit 40a is referred to as a first compensated digital output signal. Similarly, the estimated error signal generated on an output port 34b of the second estimation unit 30b is referred to as a second estimated error signal, and the compensated digital output signal generated on an output port 42b of the second subtractor 40b unit is referred to as a second compensated digital output signal $y_2(n)$. Moreover, the estimated error signal generated on an output port 34c of the third estimation unit 30c is referred to as a third estimated error signal, and the compensated digital output signal generated on an output port 42c of the third subtractor 40c unit is referred to as a third compensated digital output signal $y_3(n)$.

The first estimation unit 30a and first subtractor unit 40a are arranged as in the embodiment illustrated in FIG. 1. The second estimation unit 30b is arranged to receive the first compensated digital output signal $y_1(n)$ on its input port 32b. Since the first compensated digital output signal $y_1(n)$ is a better approximation of x(n) than the digital output signal y(n) of the ADC 10 is, the second estimation unit 30b has a more adequate input data than the first estimation unit 30a has, and is thus enabled to make an even better estimation of the nonlinearity error in the digital output signal y(n) of the ADC 10 than the first estimation unit 30a. The second subtractor unit 40b is arranged to subtract the second estimated error signal generated on the output port 34*b* of the second estimation unit 30*b* from the digital output signal y(n) of the ADC 10 to generate the second compensated digital output signal $y_2(n)$. Since the second estimated error signal is a better estimation of the nonlinearity error in the digital output signal y(n) of the ADC 10 than the first estimated error signal is, the second compensated digital output signal $y_2(n)$ is a better approximation of x(n) than the first compensated digital output signal $y_1(n)$ is.

Similarly, the third estimation unit 30*c* is arranged to receive the second compensated digital output signal $y_2(n)$ on its input port 32*c*. Since the second compensated digital output signal $y_2(n)$ is a better approximation of x(n) than the first compensated digital output signal $y_1(n)$ is, the third estimation unit 30*c* has a more adequate input data than the second estimation unit 30*b* has, and is thus enabled to make an even better estimation of the nonlinearity error in the digital output signal y(n) of the ADC 10 than the second estimation unit 30*b*. The third subtractor unit 40*c* is arranged to subtract the third estimated error signal generated on the output port 34*c* of the third estimation unit 30*c* from the digital output signal y(n) of the ADC 10 to generate the third compensated digital output signal $y_2(n)$. Since the third estimated error signal is a better estimation of the nonlinearity error in the digital output signal y(n) of the ADC 10 than the second estimated error signal is, the third compensated digital output signal $y_3(n)$ is a better approximation of x(n) than the second compensated digital output signal $y_2(n)$ is.

Above, compensation in multiple stages has been described with reference to FIG. 2, wherein the number of stages, or iterations, is three. In more general terms, embodiments of a compensation circuit 20 arranged to perform compensation in a plurality of stages comprises, in addition to the first estimation unit 30*a*, M additional estimation units, wherein M is an integer. The i:th estimation unit is adapted to generate an i:th estimated error signal on an output port of the i:th estimation unit. Furthermore, said embodiments of the compensation circuit 20 arranged to perform compensation in a plurality of stages comprises, in addition to the first subtractor unit 30*a*, M additional subtractor units. The i:th subtractor unit is arranged to subtract the i:th estimated error signal from the digital output signal y(n) of the ADC 10 and thereby generate an i:th compensated digital output signal $y_i(n)$. For $2 \leq i \leq M+1$, the i:th estimation unit is arranged to receive the (i−1):th compensated digital output signal $y_{i-1}(n)$ on its input port.

The embodiments of the compensation circuit 20 arranged to perform compensation in a plurality of stages described above provides compensated digital output signals that are gradually (for each stage) improved approximations of the desired output signal x(n). The compensated digital output signal generated by the subtractor unit in the last stage of the chain, i.e. $y_{M+1}(n)$ with reference to the general description above, may be the output signal from the compensation circuit 20. The ADC 10 together with the compensation circuit 20 provides an ADC (with $y_{M+1}(n)$ as output signal) that has a better linearity than the ADC 10 alone.

All of the plurality of estimation units (i.e. 30*a-c* in FIG. 2) in the compensation circuit 20 may be of the same type. According to some embodiments, all estimation units 30*a-c* are identical. According to other embodiments, one or more of the estimation units 30*a-c* may be different from the others. As an example, the computational precision of the estimation units may be adapted to the quality of their respective input signals. For example, for an estimation unit in an early stage of the chain, the accuracy of the generated estimated error signal may be limited by inaccuracies (in terms of deviation from x(n)) in the input signal to the estimation unit. In such a case, the requirements on computational precision for this estimation unit may be relaxed in comparison with estimation units in later stages of the chain, whereby use of a higher computational precision than necessary may be avoided. This may e.g. be utilized by representing one or more internal signals and/or model coefficients with fewer bits in said estimation unit in the early stage of the chain than in said estimation units in the later stages of the chain, which in turn facilitates a reduced power consumption and/or required circuit area.

A suitable number of stages in the compensation circuit 20 may e.g. be determined based on measurements and/or computer simulations. The following factors may be considered when determining the number of stages:

As the number of stages increases, other errors than those compensated for by the compensation circuit 20 may start to dominate. Examples of such errors may be noise, quantization errors, and/or errors due to inaccuracies in the model used internally in the estimation units. For a certain number of steps (which e.g. may be determined based on measurements and/or computer simulations), the improvement achieved by adding an additional stage may be negligible.

A system specification may dictate a certain quality, e.g. in terms of minimum signal-to-noise and distortion ratio (SNDR) or other performance metric, for the output signal from the compensation circuit 20. Once this specification is met, it may be unnecessary to add further stages in the compensation circuit 20.

A derivation of the discrete-time nonlinearity model used in embodiments of the estimation units 30*a-c* (FIGS. 1 and 2) is presented below with reference to FIGS. 3 and 4*a-f*.

Figure 3:
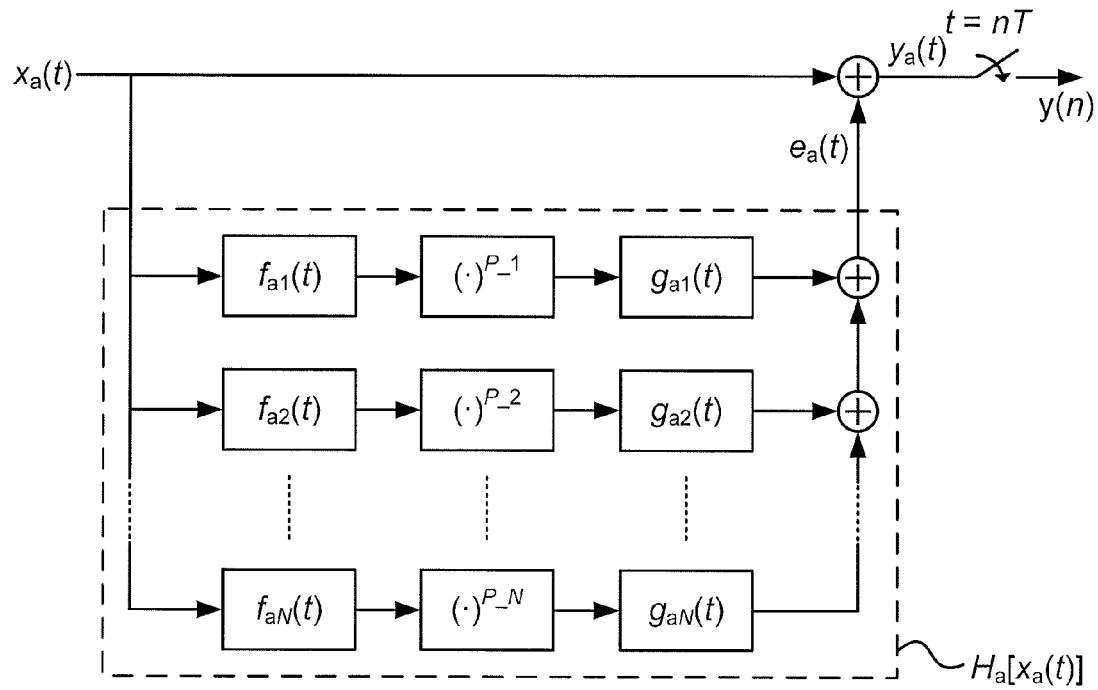
FIG. 3 illustrates a continuous-time reference model of a conversion circuit.

FIG. 3 illustrates a continuous-time reference model of the ADC 10 (or other conversion circuit) that is used as a starting point for the derivation of the discrete-time nonlinearity model. In the reference model, the continuous-time input signal $x_a(t)$ is input to a number of branches, the outputs of which are added together to form a continuous-time output signal $y_a(t)$, which is sampled at a sample rate 1/T, where T denotes the sample period, to form the discrete-time output signal $y(n) = y_a(nT)$. The upper branch in FIG. 3 provides the desired signal, whereas the other N branches contributes to a nonlinearity error $e_a(t) = H_a[x_a(t)]$, where $H_a$ is a continuous-time nonlinear operator acting on $x_a(t)$. It is readily verified that y(n)=x(n)+e(n), where the discrete-time nonlinearity error $e(n)=e_a(nT)$. The derivation below concerns a discrete-time model representing a discrete-time nonlinear operator H, which is equivalent to the continuous-time nonlinear operator $H_a$, such that $e(n)=H[x(n)]$.

In the reference model in FIG. 3, for each k such that $1 \leq k \leq N$, the k:th branch comprises a linear system with impulse response $f_{ak}(t)$, which is followed by a static nonlinearity $(\bullet)^{P\_k}$, where P_k is an integer. The static nonlinearity is in turn followed by another linear system with impulse response $g_{ak}(t)$. A nonlinear system composed of a linear system followed by a static nonlinearity and another linear system is referred to as an LNL (Linear-Nonlinear-Linear) system. A nonlinearity model, such as that illustrated in FIG. 3, having a number of parallel branches of LNL models, is referred to as a parallel LNL model. Such models are e.g. presented in the article H.-W. Chen, "Modeling and identification of parallel nonlinear systems: Structural classification and parameter estimation methods", *Proc. of the IEEE*, vol. 83, no. 1, pp. 39-66, January 1995. The model type illustrated in FIG. 3 has turned out to be useful for modeling analog electronic circuits, such as but not limited to ADCs. In the following, the linear systems with impulse responses $f_{ak}(t)$ and $g_{ak}(t)$ are referred to as the filter $f_{ak}(t)$ and filter $g_{ak}(t)$, respectively.

The set of integers [P_1, ..., P_N] should be chosen, e.g. based on measurements and/or computer simulations, such as to adequately capture the nonlinearities of the circuit to be modeled. According to one nonlimiting example, P_k=k+1, such that said set of integers consists of all integers between and including 2 and N+1. In circuits employing a differential topology, even-order distortion terms are normally cancelled or approximately cancelled. For such a circuit, a suitable choice may be P_k=2k+1, such that said set of integers consists of all odd integers between and including 3 and 2N+1.

It is assumed in the following that the continuous-time input signal $x_a(t)$ is properly bandlimited, having no (or, in practice, only negligible) spectral content above a frequency $f_0 < 1/(2T)$, such that it can be sampled at the sample rate $1/T$ without aliasing in accordance with the Nyquist sampling theorem. Even though $x_a(t)$ is properly bandlimited, the nonlinearity error $e_a(t)$ will generally not be properly bandlimited, because of spectral frequency spreading caused by the nonlinearities $(\bullet)^{P\_k}$. Hence, the signal y(n) is obtained by undersampling of $y_a(t)$, whereby signal content of $y_a(t)$ located above the frequency $1/(2T)$ is aliased into the signal band $0 \leq f < 1/(2T)$, where f denotes frequency.

Figure 4A:
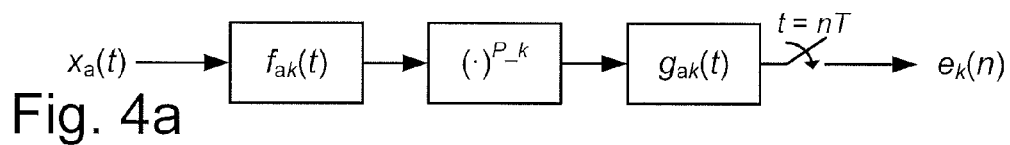
FIGS. 4a-f illustrate derivation of a discrete-time model of a conversion circuit.

FIGS. 4a-f illustrate derivation of a discrete-time model of one of the branches (the k:th branch) of the model illustrated in FIG. 3. In FIG. 4a, the sampling at times nT is moved from after the summation of the output signals of the branches (which is the case in FIG. 3) to directly after the filter $g_{ak}(t)$. The output of the sampler in FIG. 4a is denoted $e_k(n)$. It is readily verified that the discrete-time nonlinearity error $$e(n) = \sum_{k=1}^{N} e_k(n).$$

Figure 4B:
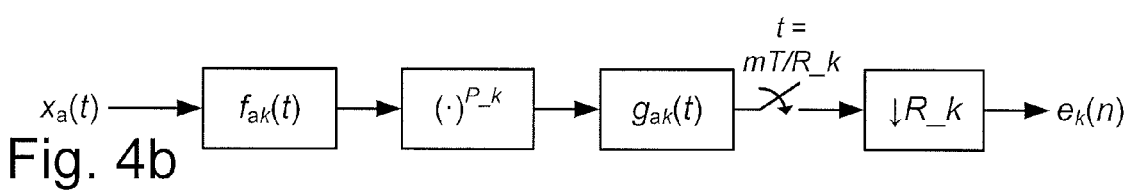

In FIG. 4b, the sampling at the output of the filter $g_{ak}(t)$ is replaced with an R_k times faster sampler followed by a downsampler that downsamples the output signal from the sampler with the factor R_k and discards the redundant samples. The factor R_k is selected larger than or equal to $T \cdot \omega_0 \cdot P\_k / \pi$, where $\omega_0 = 2\pi f_0$ is the angular frequency corresponding to the signal bandwidth frequency $f_0$. In the following, the sequence index n is used for discrete-time signals with the sample rate $1/T$ and the sequence index m is used for discrete-time signals with the sample rate R_k/T.

Figure 4C:
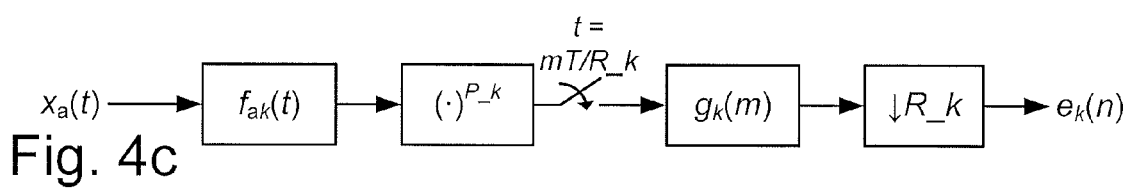

As stated above, $x_a(t)$ is bandlimited and has no spectral content above the frequency $f_0$. Consequently, the output signal of the nonlinearity $(\bullet)^{P\_k}$ is bandlimited and has no spectral content above a frequency $f_0 P\_k$. Since the factor R_k is selected larger than or equal to $T \cdot \omega_0 \cdot P\_k / \pi$, the output signal of the filter $g_{ak}(t)$ can be sampled at the sample rate R_k/T without aliasing in accordance with the sampling theorem. Hence, the filter $g_{ak}(t)$ followed by the sampler in FIG. 4b can be replaced by a sampler followed by a digital filter $g_k(m)$ having the same frequency response as $g_{ak}(t)$, i.e. $G(e^{j\omega T/R\_k}) = G_{ak}(j\omega)$, in the angular frequency region $0 \leq \omega \leq \omega_0 P\_k$, where j denotes the imaginary unit, $\omega$ denotes angular frequency, $$G(e^{j\omega T/R\_k}) = \sum_{m=-\infty}^{\infty} g_k(m) e^{-j\omega m T/R\_k}$$

denotes the discrete-time Fourier transform of $g_k(m)$, and $$G_{ak}(j\omega) = \int_{-\infty}^{\infty} g_{ak}(t) e^{-j\omega t} dt$$

denotes the continuous-time Fourier transform of $g_{ak}(t)$. This is illustrated in FIG. 4c.

Figure 4D:
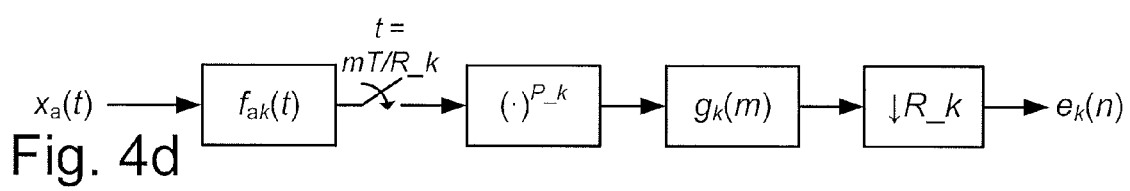

As the nonlinearity $(\bullet)^{P\_k}$ is static (memoryless), the order of the sampler and nonlinearity $(\bullet)^{P\_k}$ can be interchanged. This is shown in FIG. 4d.

Figure 4E:
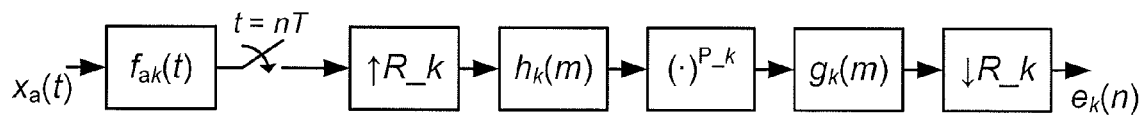

Since the filter $f_{ak}(t)$ is linear, the output signal from the filter $f_{ak}(t)$ is properly bandlimited to allow sampling at the sample rate $1/T$ without aliasing. The input signal to the nonlinearity can equivalently be obtained through sampling of the output signal at the sample rate $1/T$ and interpolating the resulting sampled signal with the factor R_k. In FIG. 4e, this is accomplished by upsampling with the factor R_k followed by filtering with an interpolation filter $h_k(m)$.

Hence, the filter $f_{ak}(t)$ followed by the sampler in FIG. 4e can be replaced by a sampler followed by a digital filter $f_k(n)$ having the same frequency response as $f_{ak}(t)$, i.e. $F(e^{j\omega T}) = F_{ak}(j\omega)$, in the angular frequency region $0 \leq \omega \leq \omega_0$, where $$F(e^{j\omega T}) = \sum_{n=-\infty}^{\infty} f_k(n) e^{-j\omega n T}$$

denotes the discrete-time Fourier transform of $f_k(n)$, and $$F_{ak}(j\omega) = \int_{-\infty}^{\infty} f_{ak}(t) e^{-j\omega t} dt$$

denotes the continuous-time Fourier transform of $f_{ak}(t)$. This is illustrated in FIG. 4f.

Figure 4F:
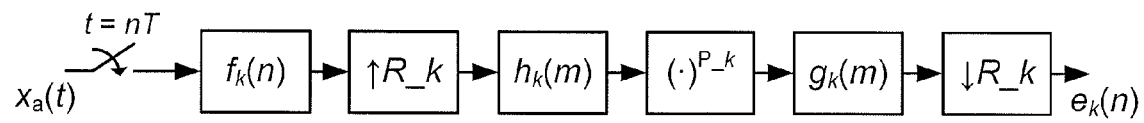

By replacing each of the branches in the nonlinear part of the model in FIG. 3 with the corresponding discrete-time branch illustrated in FIG. 4f and performing the addition of the output signals $e_k(n)$ from the different branches in discrete time to form e(n), and adding e(n) to x(n) to form y(n), a discrete-time model that is equivalent to the continuous-time model illustrated in FIG. 3 is obtained. Equivalent in this context means that the same sample values of y(n) are obtained for the derived discrete-time model as for the continuous-time model illustrated in FIG. 3. Since all branches operate at the same input sample rate $1/T$ (i.e. they all have the same input signal x(n)), a single sampler arranged to sample $x_a(t)$ to form x(n) can be shared between all of the branches in the discrete-time model.

As is described below in the context of embodiments of the estimation unit 30, use of a polyphase representation of filters in FIG. 4f enables the use of the sample rate $1/T$ throughout the whole equivalent discrete-time model. That is, although the nonlinearities increase the bandwidth of the signals, it is not necessary to use a sample rate that is higher than $1/T$ anywhere inside the model.

Figure 5:
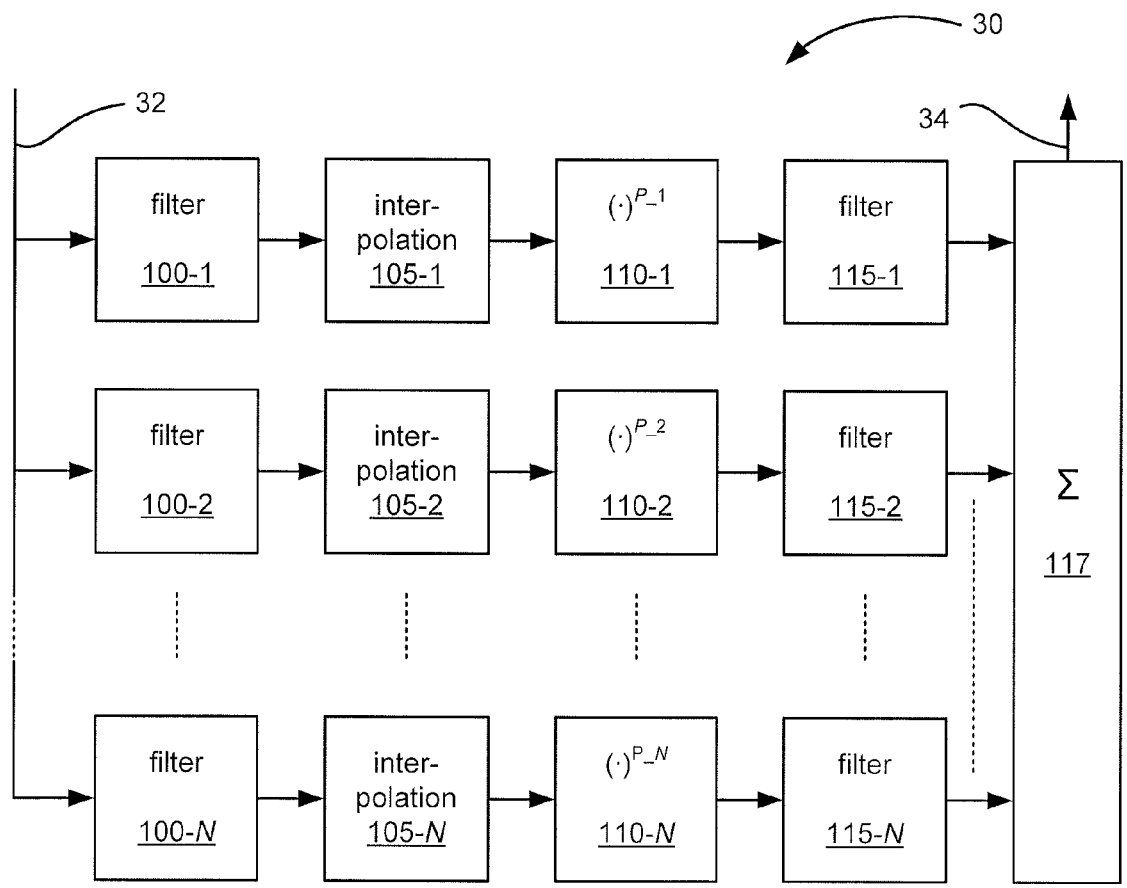
FIG. 5 is a block diagram of an estimation unit according to an embodiment of the present invention.

FIG. 5 is a block diagram of an estimation unit 30 according to an embodiment of the present invention. The estimation unit 30 may e.g. be any one of the estimation units 30a-c in FIGS. 1 and 2. The internal structure of the estimation unit 30 in the embodiment illustrated in FIG. 5 is based on and motivated by the discrete-time model derived above with reference to FIGS. 3 and 4a-f.

According to the embodiment, the estimation unit 30 comprises an input port 32 for receiving a digital input signal having the sample rate 1/T. The input port 32 corresponds to the input ports 32a-c of the estimation units 30a-c in FIGS. 1 and 2. Furthermore, the estimation unit 30 comprises an output port 34 for outputting a digital estimated error signal also having the sample rate 1/T. The output port 34 corresponds to the output ports 34a-c of the estimation units 30a-c in FIGS. 1 and 2.

For each integer P_k in a set of integers (where k is an integer in the range 1≤k≤N), the estimation unit 30 comprises a computational branch comprising a first linear filter unit 100-k, an interpolation unit 105-k, a nonlinearity unit 110-k, and a second linear filter unit 115-k.

The first linear filter unit 100-k corresponds to the filter $f_k(n)$ in FIG. 4f. It is arranged to generate a first signal $s_1(n)$ as a linear function of the digital input signal to the estimation unit 30. For this purpose, it is arranged to operate at the sample rate 1/T and perform filtering with the impulse response $f_k(n)$.

The interpolation unit 105-k corresponds to the upsampler with the factor R_k in combination with the interpolation filter $h_k(m)$ in FIG. 4f. It is arranged to interpolate the first signal $s_1(n)$ to generate a second signal $s_2(m)$ having the sample rate R_k/T (where R_k≥T·ω₀P_k/π as discussed above).

The nonlinearity unit 110-k corresponds to the nonlinearity $(\bullet)^{P\_k}$ in FIG. 4f. It is arranged to generate a third signal $s_3(m)$ as $(s_2(m))^{P\_k}$.

The second linear filter unit 115-k corresponds to the filter $g_k(m)$ in combination with the downsampler with the factor R_k in FIG. 4f. However, if the second linear filter unit 115-k is implemented using a polyphase decomposition, as is described below with reference to FIG. 8b, no actual downsampling is needed to be performed in the second linear filter unit 115-k, since only every R_k:th sample of the output signal from the filter $g_k(m)$ is then actually generated in the second linear filter unit 115-k. The second linear filter unit 115-k is arranged to generate a component, corresponding to $e_k(n)$ in FIG. 4f, of the estimated error signal based on the third signal $s_3(m)$. Said component has the sample rate 1/T.

The second linear filter unit 115-k is arranged to perform filtering that is linear and time variant, in contrast to the first linear filter unit 100-k, which is arranged to perform filtering that is linear and time-invariant. The time-variance of the second linear filter unit 115-k is due to that the input signal to the second linear filter 115-k has a higher sample rate than the output signal from the second linear filter unit 115-k. Note, however, that the branch as a whole, i.e. from the input port of the first linear filter unit 100-k to the output port of the second linear filter unit 115-k is time invariant.

According to the embodiment illustrated in FIG. 5, the estimation unit 30 further comprises an adder circuit 117 arranged to generate the estimated error signal, to be output on the output port 34, as the sum of the components of the estimated error signal generated in the computational branches of the estimation unit 30.

Figure 6A:
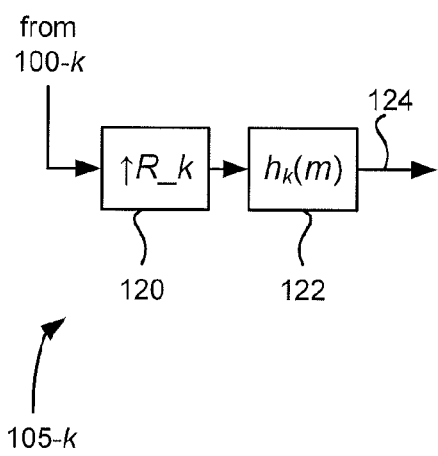
FIGS. 6a and b are block diagrams of embodiments of an interpolation unit.

FIGS. 6a and b illustrate different embodiments of the interpolation unit 105-k. According to the embodiment illustrated in FIG. 6a, which can be seen as a direct mapping of the corresponding part of the illustration in FIG. 4f, the interpolation unit 105-k comprises an upsampler unit 120 and a digital filter unit 122. The upsampler unit 120 is adapted to upsample the output signal from the first linear filter unit 105-k with the factor R_k by inserting R_k−1 zeros (or samples of another value representing a DC-level of the signal) between each sample of the output signal from the first linear filter unit 105-k. The digital filter unit 122 is arranged to operate at the sample rate R_k/T and perform filtering with the impulse response $h_k(m)$ for generating the second signal $s_2(m)$. The second signal $s_2(m)$ is output on an output port 124 of the digital filter unit 122.

Figure 6B:
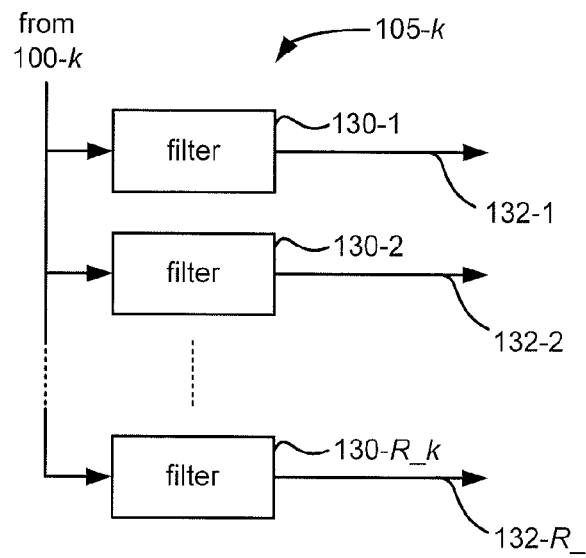

The embodiment illustrated in FIG. 6b utilizes a polyphase decomposition of the filter $h_k(m)$. In this embodiment, the interpolation unit 105-k comprises R_k computational branches. Each of these computational branches comprises a digital filter unit 130-1, . . . , 130-R_k, which is a polyphase component of the interpolation filter $h_k(m)$. Each of these digital filter units 130-1, . . . , 130-R_k is adapted to generate every R_k:th sample of the second signal $s_2(m)$. For example, for each i=0, 1, 2, . . . , R_k−1, the digital filter unit 130-(i+1) can be arranged to generate the samples $s_2(n·R\_k+i)$ and output these samples on an output port 132-(i+1) of the digital filter unit 130-(i+1). If $$H_k(z) = \sum_{m=-\infty}^{\infty} h_k(m) z^{-m}$$

denotes the z-transform of $h_k(m)$, $h_{ki}(n)$ denotes the impulse response of the digital filter 130-(i+1), and $$H_{ki}(z) = \sum_{n=-\infty}^{\infty} h_{ki}(n) z^{-n}$$

denotes the z-transform of $h_{ki}(n)$, then $H_k(z)$ and $H_{ki}(z)$ are related according to $$H_k(z) = \sum_{i=0}^{R\_k-1} H_{ki}(z^{R\_k}) z^{-i}.$$

An advantage of the polyphase decomposition is that each of the digital filter units 130-1, . . . , 130-R_k operates at the sample rate 1/T. This in turn facilitates a reduced power consumption and relaxed circuit-speed requirements compared with the embodiment illustrated in FIG. 6a, wherein the digital filter unit 122 is arranged to operate at the higher sample rate R_k/T.

Figure 7A:
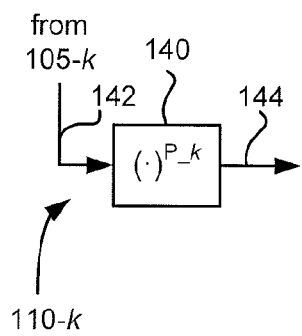
FIGS. 7a and b are block diagrams of embodiments of a nonlinearity unit.

FIGS. 7a and b illustrate different embodiments of the nonlinearity unit 110-k. In the embodiment illustrated in FIG. 7a, the nonlinearity unit 110-k comprises a single computational branch 140, which is arranged to operate at the sample rate R_k/T, receive every sample of the second signal $s_2(m)$ on an input port 142 of the computational branch 140, and generate every sample of the third signal $s_3(m)$ on an output port 144 of the computational branch 140. In embodiments where the interpolation unit 105-k is implemented as in FIG. 6a, the input port 142 of the computational branch 140 can be directly connected to the output port 124 of the digital filter unit 122. In embodiments where the interpolation unit 105-k is implemented as in FIG. 6b, an interface circuit (not shown), such as a multiplexer, may be used for providing an operative connection between an appropriate one of the output ports 132-1, ..., 132-R_k and the input port 142 of the computational branch 140 for each sample period.

Figure 7B:
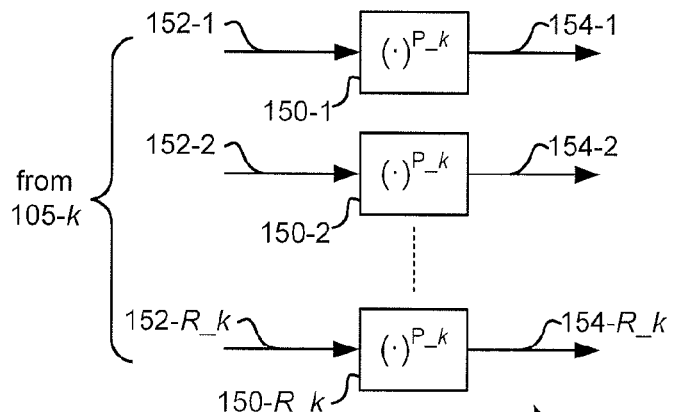

In the embodiment illustrated in FIG. 7b, the nonlinearity unit 110-k comprises R_k computational branches 150-1, ..., 150-R_k. Each of the computational branches 150-1, ..., 150-R_k is adapted to operate on the sample rate 1/T and receive every R_k:th sample of the second signal $s_2(m)$ on an input port 152-1, ..., 152-R_k of the computational branch 150-1, ..., 150-R_k. Furthermore, each of the computational branches 150-1, ..., 150-R_k is adapted to generate every R_k:th sample of the third signal $s_3(m)$ on an output port 154-1, ..., 154-R_k of the computational branch 150-1, ..., 150-R_k. For example, for each i=0, 1, 2, ..., R_k−1, the computational branch 150-(i+1) can be arranged to receive the samples $s_2(n \cdot R\_k+i)$ on its input port 152-(i+1) and generate the samples $s_3(n \cdot R\_k+i)$ on its output port 154-(i+1).

In embodiments where the interpolation unit 105-k is implemented as in FIG. 6b, each of the input ports 152-1, ..., 152-R_k of the computational branches 150-1, 150-R_k can be directly connected to a unique one of the output ports 132-1, ..., 132-R_k of the digital filter units 130-1, ..., 130-R_k. For example, for each i=0, 1, 2, ..., R_k−1, the input port 152-(i+1) can be directly connected to the output port 132-(i+1).

In embodiments where the interpolation unit 105-k is implemented as in FIG. 6a, an interface circuit (not shown), such as a demultiplexer, may be used for providing an operative connection between the output port 124 of the digital filter unit 122 and an appropriate one of the input ports 152-1, ..., 152-R_k of the computational branches 150-1, ..., 150-R_k for each sample period.

Figure 8A:
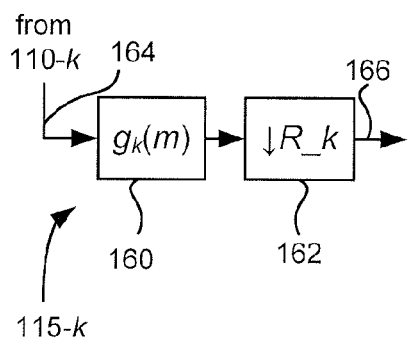
FIGS. 8a and b are block diagrams of embodiments of a linear filter unit.

FIGS. 8a and b illustrate different embodiments of the second linear filter unit 115-k. According to the embodiment illustrated in FIG. 8a, which can be seen as a direct mapping of the corresponding part of the illustration in FIG. 4f, the second linear filter unit 115-k comprises a digital filter unit 160 and a downsampler unit 162. The digital filter unit 160 is arranged to operate at the sample rate R_k/T, receive every sample of the third signal $s_2(m)$ on an input port 164 of the digital filter unit 160, and perform filtering with the impulse response $g_k(m)$. The downsampler unit 162 is adapted to downsample the output signal from the digital filter unit 160 with the factor R_k by discarding all but every R_k:th sample of the output signal from the digital filter unit 160 for generating the component of the estimated error signal to be input to the adder circuit 117 (FIG. 5) on an output port 166 of the downsampler unit 162.

In embodiments where the nonlinearity unit 110-k is implemented as in FIG. 7a, the input port 164 of the digital filter unit 160 can be directly connected to the output port 144 of the computational branch 140.

In embodiments where the nonlinearity unit 110-k is implemented as in FIG. 7b, an interface circuit (not shown), such as a multiplexer, may be used for providing an operative connection between an appropriate one of the output ports 154-1, ..., 154-R_k and the input port 164 of the digital filter unit 160 for each sample period.

Figure 8B:
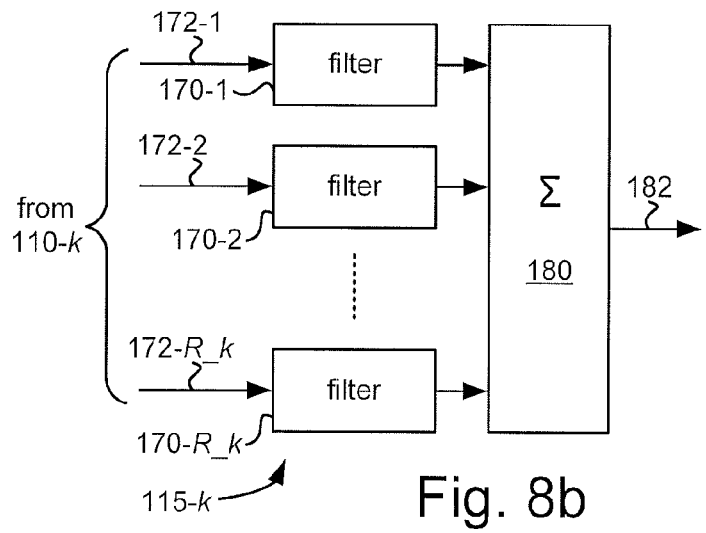

The embodiment illustrated in FIG. 8b utilizes a polyphase decomposition of the filter $g_k(m)$. In this embodiment, the second linear filter unit 115-k comprises R_k computational branches. Each of the R_k computational branches comprises a digital filter unit 170-1, ..., 170-R_k, which is a polyphase component of the filter $g_k(m)$. Each of the digital filters 170-1, ..., 170-R_k is adapted to operate at the sample rate 1/T and receive every R_k:th sample of the third signal $s_3(m)$ on an input port 172-1, ..., 172-R_k of the digital filter unit 170-1, ..., 170-R_k. For example, for each i=0, 1, 2, ..., R_k−1, the digital filter unit 170-(i+1) can be arranged to receive the samples $s_3(n \cdot R\_k+i)$ on its input port 172-(i+1). If $$G_k(z) = \sum_{m=-\infty}^{\infty} g_k(m) z^{-m}$$

denotes the z-transform of $g_k(m)$, $g_{ki}(n)$ denotes the impulse response of the digital filter 170-(i+1), and $$G_{ki}(z) = \sum_{n=-\infty}^{\infty} g_{ki}(n) z^{-n}$$

denotes the z-transform of $g_{ki}(n)$, then $G_k(z)$ and $G_{ki}(z)$ are related according to $$G_k(z) = \sum_{i=0}^{R\_k-1} G_{ki}(z^{R\_k}) z^i.$$

Furthermore, in the embodiment illustrated in FIG. 8b, the second linear filter unit comprises an adder circuit 180 for generating the component of the estimated error signal to be input to the adder circuit 117 (FIG. 5) on an output port 182 of the adder circuit 180 as the sum of output signals from the digital filter units 170-1, ..., 170-R_k.

Similarly to the embodiment of the interpolation unit 105-k illustrated in FIG. 6b, an advantage of the polyphase decomposition utilized in the embodiment illustrated in FIG. 8b is that each of the digital filter units 170-1, ..., 170-R_k operates at the sample rate 1/T. This in turn facilitates a reduced power consumption and relaxed circuit-speed requirements compared with the embodiment illustrated in FIG. 8a, wherein the digital filter unit 160 is arranged to operate at the higher sample rate R_k/T.

In embodiments where the nonlinearity unit 110-k is implemented as in FIG. 7b, each of the input ports 172-1, ..., 172-R_k of the digital filter units 170-1, ..., 170-R_k can be directly connected to a unique one of the output ports 154-1, ..., 154-R_k of the computational branches 150-1, ..., 150-R_k. For example, for each i=0, 1, 2, ..., R_k −1, the input port 172-(i+1) can be directly connected to the output port 154-(i+1).

In embodiments where the nonlinearity unit 110-k is implemented as in FIG. 7a, an interface circuit (not shown), such as a demultiplexer, may be used for providing an operative connection between the output port 144 of the computational branch 140 and an appropriate one of the input ports 172-1, ..., 172-R_k of the digital filter units 170-1, ..., 170-R_k for each sample period.

Figure 9:
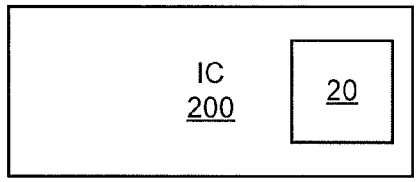
FIG. 9 schematically illustrates an integrated circuit according to an embodiment of the present invention.

According to some embodiments of the present invention, the compensation circuit 20 (FIGS. 1 and 2) may be integrated on an integrated circuit (IC). This is schematically illustrated in FIG. 9, showing an IC 200 comprising the compensation circuit 20.

Figure 10:
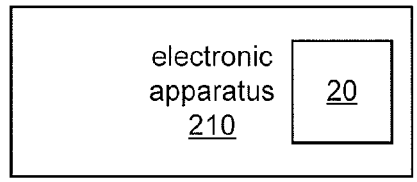
FIG. 10 schematically illustrates an electronic apparatus according to an embodiment of the present invention.

According to some embodiments of the present invention, the compensation circuit 20 (FIGS. 1 and 2) may be comprised in an electronic apparatus. This is schematically illustrated in FIG. 10, showing an electronic apparatus 210 comprising the compensation circuit 20. The electronic apparatus 210 may e.g. comprise the electronic circuit 1 (FIG. 1) and/or the IC 200 (FIG. 9). The electronic apparatus 210 may e.g. be, but is not limited to, a measurement equipment, such as a digital oscilloscope, spectrum analyzer, or the like, that utilizes an ADC for signal measurement, a radio receiver for communication, or radar equipment.

According to some embodiments of the present invention, there is provided a method of compensating nonlinearity-errors of the ADC 10 (FIG. 1). The method may e.g. be performed by the compensation circuit 20 (FIGS. 1 and 2). According to embodiments of the method, the digital output signal from the ADC 10 is received, e.g. on the input port 22 of the compensation circuit 20 (FIGS. 1 and 2). Furthermore, according to embodiments of the method, a first estimated error signal is generated, e.g. by the (first) estimation unit 30a (FIGS. 1 and 2) using the digital output signal of the ADC 10 as a digital input signal to a method of estimating a nonlinearity error of the ADC 10. Embodiments of said method of estimating the nonlinearity error are further described below. Moreover, according to embodiments of the method, a first compensated digital output signal is generated, e.g. by the (first) subtractor unit 40a (FIGS. 1 and 2) by subtracting the first estimated error signal from the digital output signal of the ADC 10.

Additionally, embodiments of the method may comprise generating M additional compensated digital output signals. For example, for 2≤i≤M+1, an i:th estimated error signal may be generated, e.g. in an i:th estimation unit (such as the second and third estimation unit 30b and c in FIG. 2) according said method of estimating the nonlinearity error using the (i−1):th compensated output signal as the digital input signal. Furthermore, the i:th compensated digital output signal may be generated, e.g. by an i:th subtractor unit (such as the second and third subtractor unit 40b and c in FIG. 2) by subtracting the i:th estimated error signal from the digital output signal of the ADC 10.

Figure 11:
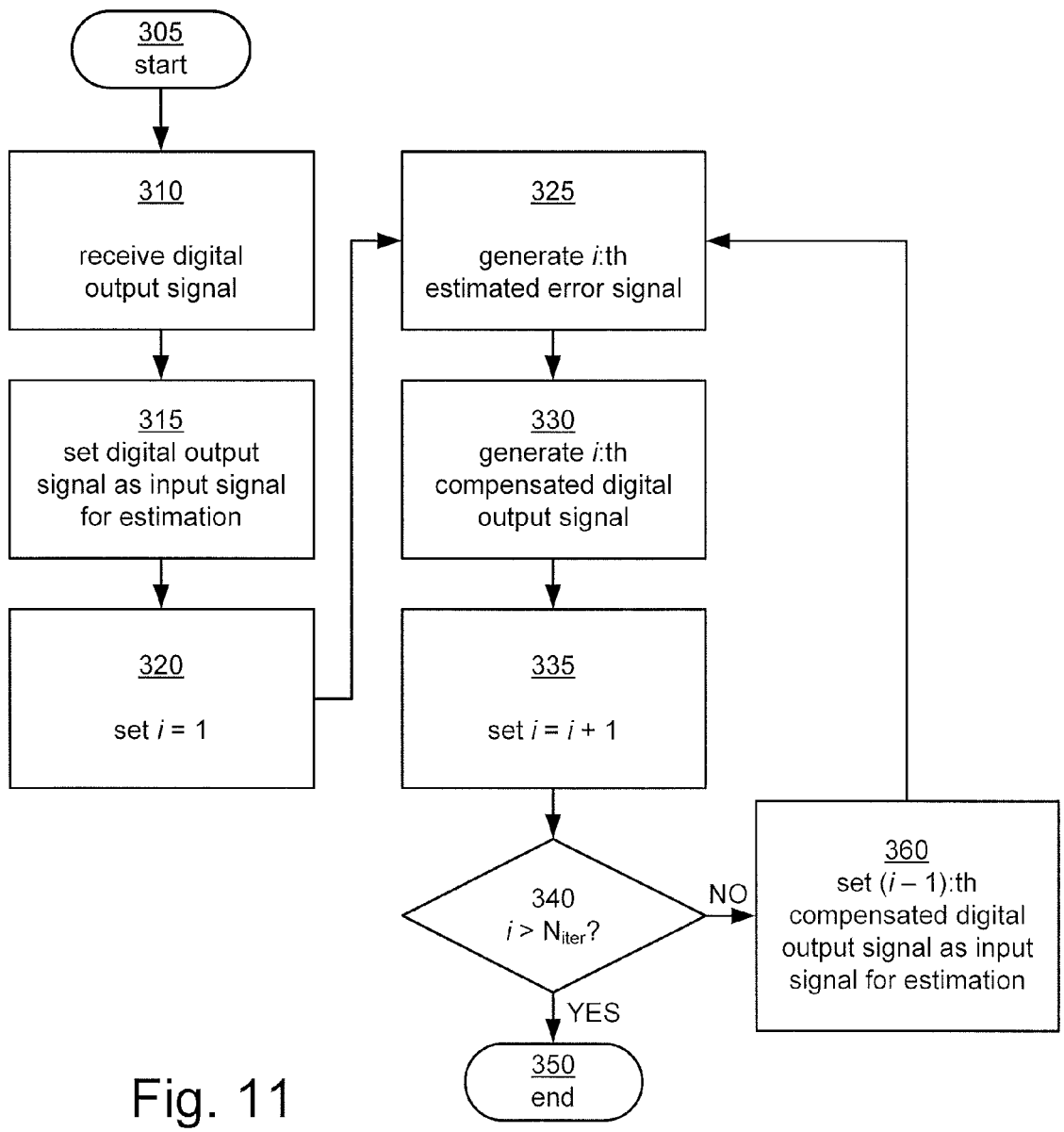
FIGS. 11 and 12 are flow charts for methods according to embodiments of the present invention.

FIG. 11 is a flow chart for embodiments of the method of compensating nonlinearity-errors of the ADC 10 discussed above. According to this flow chart, compensation is performed in $N_{iter}$ iterations. $N_{iter}$ corresponds to the number of stages of the compensation circuit 20 illustrated in FIGS. 1 and 2. The example of the compensation circuit 20 shown in FIG. 1 corresponds to $N_{iter}=1$. The example of the compensation circuit 20 shown in FIG. 2 corresponds to $N_{iter}=3$. The value of $N_{iter}$ may be chosen based on the same considerations as the number of stages in the compensation circuit 20 as described above.

In step 305, the method is commenced. The digital output signal of the ADC 10 is received in step 310. In step 315, the digital output signal of the ADC 10 is set as an input signal for error estimation. In step 320, an iteration index i is set to 1.

In step 325, the i:th estimated error signal is generated based on the input signal for the estimation. In step 330, the i:th compensated digital output signal is generated by subtracting the i:th estimated error signal from the digital output signal of the ADC 10. In step 335, the iteration index i is incremented. In step 340, it is checked whether the iteration index i exceeds the number of iterations $N_{iter}$. If the answer in step 340 is yes, the method is ended in step 350. If the answer in step 340 is no, the (i−1):th compensated digital output signal is set as the input signal for the estimation in step 360, and the method then returns to step 325.

It should be noticed that various modifications could be made to the method illustrated in FIG. 11. For example, although the steps illustrated in FIG. 11, for simplicity, have been shown as steps being executed in sequence, some or all of these steps may represent continually ongoing processes being executed in parallel. For example some samples of the digital output signal of the ADC 10 may be received while other samples of estimated error signals and/or compensated digital output signals are being generated. Furthermore, the iteration index i is used in FIG. 11 to obtain a generic representation for any value of $N_{iter}$. However, for a given value of $N_{iter}$, the iteration index i may be omitted and the generation of each estimated error signal and compensated digital output signal may be assigned its own dedicated step.

According to embodiments of the present invention, as indicated above, there is provided a method of estimating a nonlinearity error of the ADC 10. The method may e.g. be performed by any of the estimation units 30 (FIG. 5) or 30a-c (FIGS. 1 and 2). According to embodiments of the method, a digital input signal for the estimation having the sample rate 1/T is received, e.g. on the input port 32 (FIG. 5) or 32a-c (FIGS. 1 and 2). The digital input signal for the estimation is an approximation of the continuous-time input signal to the ADC 10. For each integer P_k in a set of integers, a component of an estimated error signal is generated. A first signal $s_1(n)$ is generated as a linear function of the digital input signal for the estimation, e.g. by the first linear filter unit 100-k (FIG. 5). The first signal $s_1(n)$ is interpolated, e.g. by the interpolation unit 105-k (FIGS. 5 and 6a-b), to generate a second signal $s_2(m)$ having the sample rate R_k/T, wherein $R\_k \geq T \cdot \omega_0 \cdot P\_k/m$. Furthermore, a third signal $s_3(m)$ is generated, e.g. by the nonlinearity unit 110-k (FIGS. 5 and 7a-b), as $(s_2(m))^{P\_k}$. Moreover, the component of an estimated error signal is generated, e.g. by the second linear filter unit 115-k (FIGS. 5 and 8a-b), based on linear filtering of the third signal $s_3(m)$, wherein said component has the sample-rate 1/T. The estimated error signal is generated as the sum of the components of the estimated error signal generated for each P_k.

Figure 12:
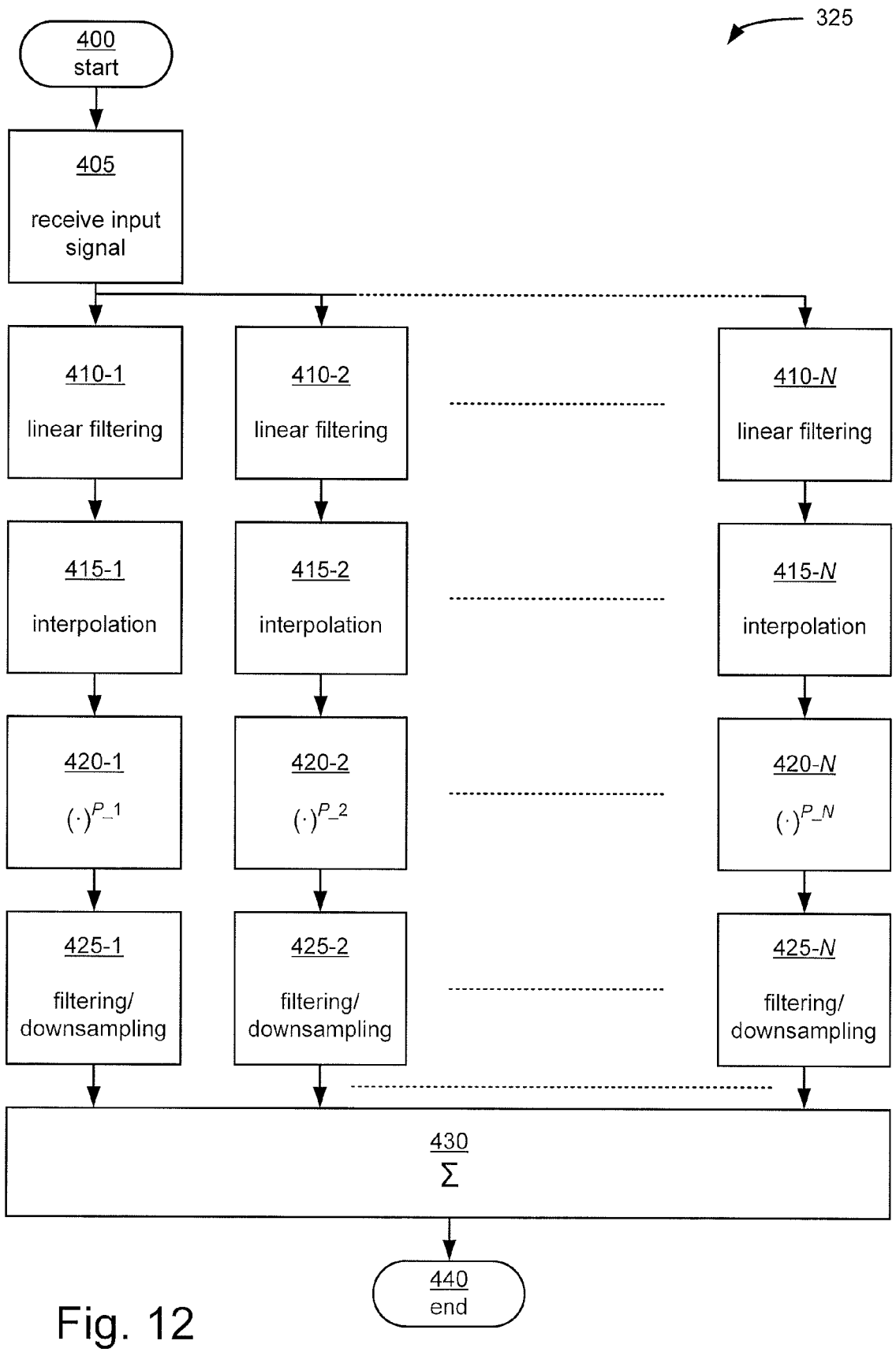

FIG. 12 is a flow chart for an embodiment of the method of estimating the nonlinearity error of the ADC 10. As indicated in FIG. 12, the method may be used for implementing step 325 in the flow chart shown in FIG. 11. The method is started in step 400. In step 405, the digital input signal for the estimation is received. Processing of the digital input signal for the estimation is performed in a separate branch of the flow chart in FIG. 12 for each integer P_k in the set of integers [P_1, P_2, ..., P_N]. In step 410-k, the first signal $s_1(n)$ is generated, by means of linear filtering of the digital input signal for the estimation. In step 415-k, the second signal $s_2(m)$ is generated by means of interpolation of the first signal $s_1(n)$. In step 420-k, the third signal $s_3(m)$ is generated as $(s_2(m))^{P\_k}$. Linear filtering is applied to the third signal $s_3(m)$ in step 425-k for generating said component of the estimated error signal. In step 430, the components of the estimated error signal generated in steps 425-1, 425-2, ..., 425-N are added together to final the estimated error signal. The method is ended in step 440.

Similar to the embodiment of the method illustrated in FIG. 11, it should be noticed that various modifications could be made to the embodiment of the method illustrated in FIG. 12. For example, although the steps of each branch illustrated in FIG. 12, for simplicity, have been shown as steps being executed in sequence, some or all of these steps may represent continually ongoing processes being executed in parallel. For example some samples of the digital input signal to the estimation may be received while other samples of the first signal $s_1(n)$, second signal $s_2(n)$, third signal $s_3(n)$, components of the estimated error signal, and/or estimated error signal are being generated.

In embodiments of the present invention described above, a factor $R\_k \geq T \cdot \omega_0 \cdot P\_k/\pi$ has been used. In many cases, it is beneficial, e.g. in terms circuit area requirements, power consumption, and/or circuit speed requirements, to use the smallest value of R_k that fulfils this condition.

In the embodiments described so far, it has been assumed that the continuous-time input signal to the ADC is bandlimited to an angular frequency band $[0, \omega_0]$ where $\omega_0 < \pi/T$, i.e. an angular frequency band within the first Nyquist band $0 \le \omega \le \pi/T$. According to other embodiments, the continuous time input signal to the ADC 10 may instead be bandlimited to an angular frequency band within a higher-order Nyquist band, i.e. an angular frequency band $[\omega_1, \omega_2]$, where $\omega_1 > (L-1)\pi/T$, $\omega_2 < \pi/T$, and L is a positive integer defining the order of the Nyquist band. That is, the ADC 10 may be arranged to perform undersampling. The case L=1 corresponds to the first Nyquist band, where $\omega_2 = \omega_0$. For L=1, it is not necessary that $\omega_1 > 0$, $\omega_1$ may be equal to 0 as well as indicated above with the frequency band $[0, \omega_0]$. However, stating in general that an embodiment of the present invention is operable for $\omega_1 > (L-1)\pi/T$, $\omega_2 < L\pi/T$ does not exclude that the embodiment may also be operable for $\omega_1 = 0$ when L=1.

Figure 13:
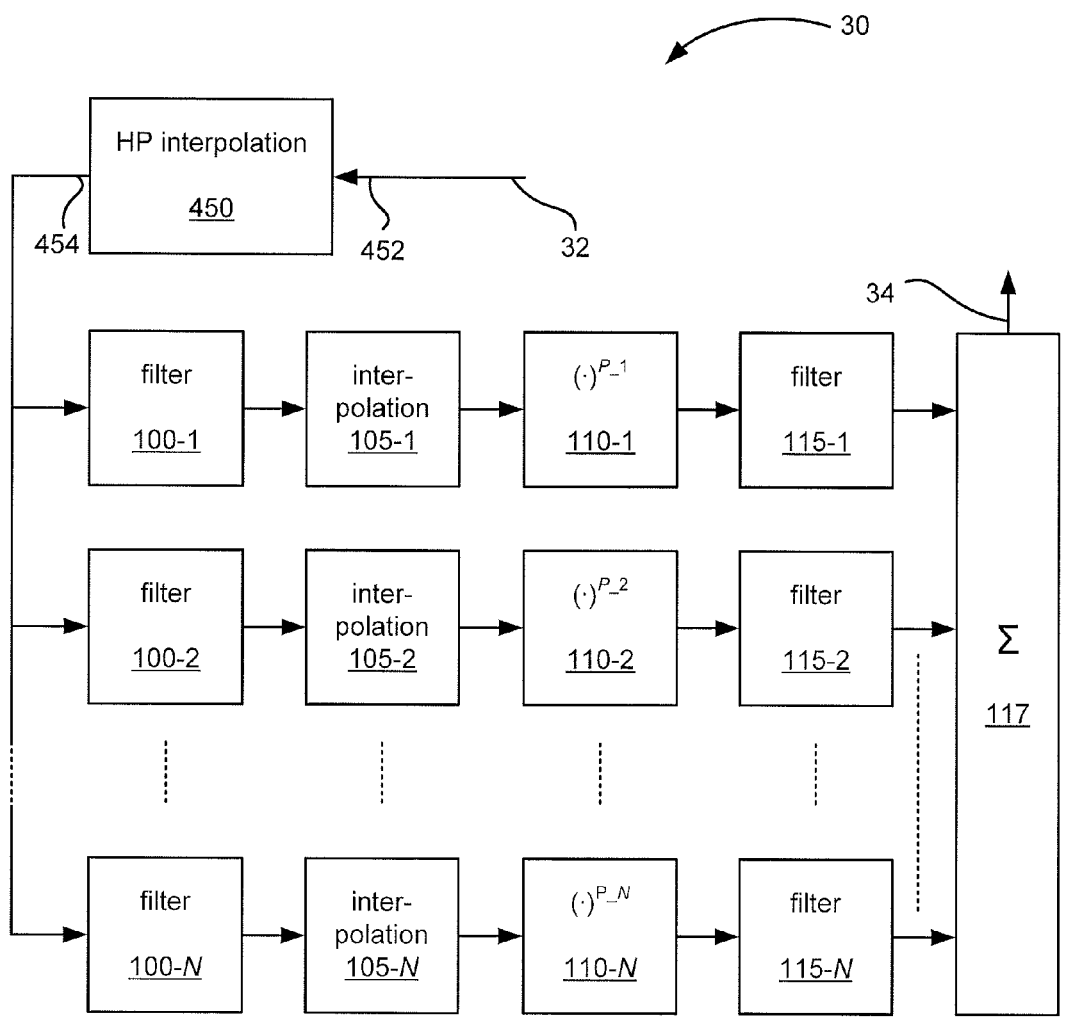
FIG. 13 is a block diagram of an estimation unit according to an embodiment of the present invention.

For the case L>1, modified versions of the embodiments described above may be used. Consider the continuous-time model illustrated in FIG. 3. The output signal from a nonlinerity $(\cdot)^{P\_k}$ is bandlimited and has no spectral content above an angular frequency $\omega_2 \cdot P\_k$. Hence, it can be sampled without aliasing using a sample rate $L \cdot R\_k/T$, where $L \cdot R\_k \ge T \cdot \omega_2 \cdot P\_k/\pi$. Analogously, with reference to FIG. 5, to avoid aliasing in the nonlinearity unit 110-k for L>1, the second signal $s_2(m)$ mentioned above should have a sample rate which is a factor $L \cdot R\_k$ higher than 1/T. An embodiment of the estimation 30 for achieving this is illustrated in FIG. 13. Elements that are similar or the same as in the embodiment illustrated in FIG. 5 are denoted with the same reference signs in FIG. 13 as in FIG. 5 and are not described in any further detail below. In the embodiment illustrated in FIG. 13, a high-pass interpolation unit 450 is inserted between the input port 32 and the first linear filter units 100-1, . . . , 100-N. An input port 452 of the high-pass interpolation unit 450 is connected to the input port 32 of the estimation unit 30, and an output port 454 of the high-pass interpolation unit 450 is connected to the first linear filter units 100-1, . . . , 100-N. The high-pass interpolation unit 450 is arranged to perform high-pass interpolation of the digital input signal to the with the factor L for generating an interpolated input signal. The interpolated input signal is in the following denoted $x_i(l)$, where the sequence index l is used to indicate that this signal has another sample rate than signals with sequence index n or m. The high-pass interpolation unit 450 together with the interpolation unit 105-k, which is arranged to perform interpolation with the factor R_k, provides the second signal $s_2(m)$ output from the interpolation unit 105-k with a sample rate that is the factor $L \cdot R\_k$ higher than 1/T.

Figure 14:
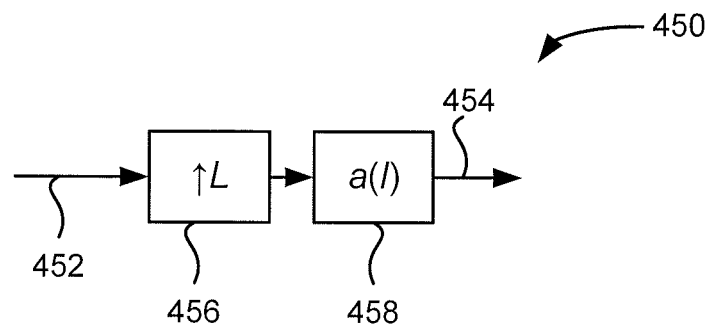
FIG. 14 is a block diagram of a high-pass interpolation unit according to an embodiment of the present invention.

FIG. 14 is a block diagram of the high-pass interpolation unit 450 according to an embodiment. According to the embodiment, the high-pass interpolation unit 450 comprises an upsampler unit 456 connected to the input port 452 of the high-pass interpolation unit 450 for receiving the digital input signal of the estimation unit 30. The upsampler unit 456 is adapted to generate an output signal of the upsampler unit 456 by inserting L−1 zeros between each sample of the digital input signal of the estimation unit 30. The output signal of the upsampler unit 456 comprises L spectral images of the digital input signal of the estimation unit 30 in different frequency bands. A high-pass filter 458 with impulse response a(l) is comprised in the high-pass interpolation unit 450 for high-pass filtering the output signal of the upsampler unit 456 and thereby generating the interpolated input signal $x_i(l)$, such that $x_i(l)$ essentially only contains the one of said spectral images that resides in the highest frequency band, which corresponds to the Lth Nyquist band. Various other realizations of the high-pass interpolation unit 450 are also possible. For example, the high-pass interpolation unit 450 may be realized using a polyphase decomposition of the filter a(l), as is discussed above with reference to embodiments of the interpolation unit 105-k.

Figure 15A:
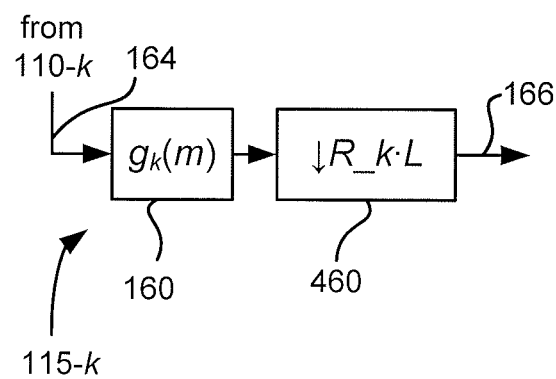
FIGS. 15a-b are block diagrams of a linear filter unit according to embodiments of the present invention.

FIG. 15a is a block diagram of the second linear filter unit 115-k according to an embodiment. This embodiment corresponds to the embodiment illustrated in FIG. 8a, but adapted for operation with signals in the Lth Nyquist band. In comparison with the embodiment illustrated in FIG. 8a, the downsampler unit 162 adapted to perform downsampling with the factor R_k in FIG. 8a has been replaced with a downsampler unit 460 adapted to perform downsampling with the factor $R\_k \cdot L$ in FIG. 15a, such that the output signal from the second linear filter unit is given the sample rate 1/T.

Figure 15B:
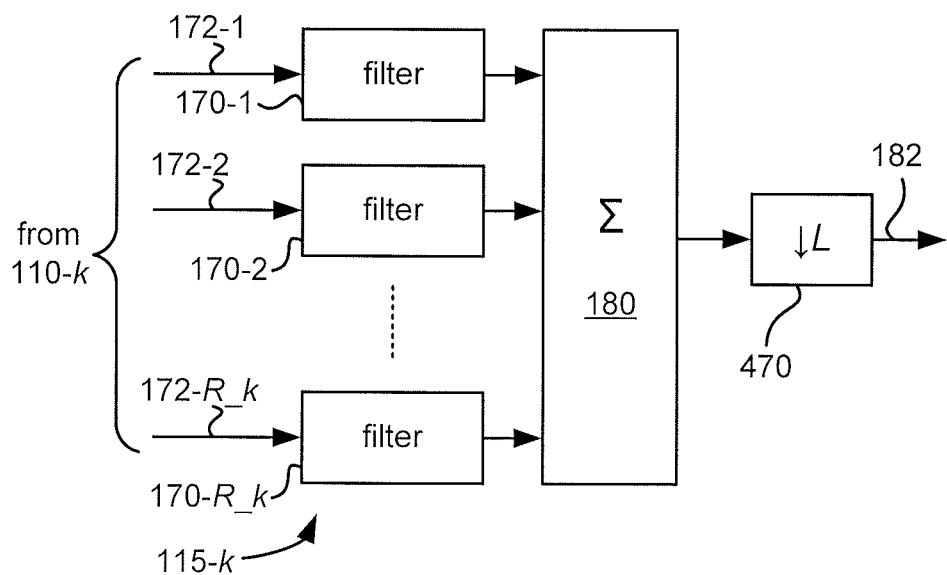

FIG. 15b is a block diagram of the second linear filter unit 115-k according to another embodiment. This embodiment corresponds to the embodiment illustrated in FIG. 8b, but adapted for operation with signals in the Lth Nyquist band. In comparison with the embodiment illustrated in FIG. 8b, a downsampler unit 470 adapted to perform downsampling with the factor L has been added between the adder circuit 180 and the output port 182, such that the output signal from the second linear filter unit is given the sample rate 1/T. Alternatively, a downsampler unit (not shown) adapted to perform downsampling with the factor L may be arranged between each of the digital filter units 170-1, . . . , 170-R_k and the adder circuit 180.

For practical continuous-time signals, it is not possible to obtain a truly bandlimited signal having no spectral content outside a given signal frequency band. For example due to noise and the fact that such practical signals have a finite length in time, there will in practice be a certain amount of spectral content outside said signal frequency band, which may be aliased into the signal frequency band when sampling the signal. Hence, the term bandlimited, when used in this specification, should not be interpreted strictly, but rather as "essentially bandlimited", i.e. having only a negligible amount of spectral content outside of the signal frequency band. How much a "negligible amount" is could e.g. be determined from application to application based on a system requirement of that application (e.g. an SNR requirement) using e.g. calculations, computer simulations, and/or circuit measurements.

It is an advantage of embodiments of the invention that nonlinearity errors in the output signal of the ADC 10 can be estimated and compensated for without having to increase the sample rate of the ADC 10. Furthermore, for a given memory length and order of the nonlinearity, the computational complexity of the discrete-time model used in the embodiments of the present invention is considerably lower than e.g. for a corresponding Volterra model, which requires computation of a number of multidimensional convolutions.

Filter coefficients of the filter units 100-k and 115-k (FIGS. 5 and 13), which are model parameters for the discrete-time ADC model used in the estimation unit 30, 30a-c (FIGS. 1, 2, 5, and 13), should be set such that said discrete-time model mimics the behavior of the ADC 10 (FIG. 1) with a desired accuracy, which may e.g. depend on a system specification for a system in which the ADC 10 is used. Various parameter-estimation methods are known and can be used for this purpose. Parameter estimation may e.g. be accomplished as outlined below (with reference to the circuitry shown in FIG. 1):

apply one or more known test signals having one or more frequency bands with no or only negligible signal energy content to the input port of the ADC 10;

measure the corresponding signal energy in said frequency bands in the compensated digital output signal; and adapt the model parameters until the signal energy in said frequency bands in the compensated digital output signal is minimized or essentially minimized using an optimization (minimization) technique.

The optimization technique may e.g. be any suitable optimization technique, such as, but not limited to, a steepest-descent technique or a simulated-annealing technique. If more than one known test signal is used, these known test signals may be applied one at a time in a sequential fashion, and the signal energy in said frequency bands may be measured for each test signal. When all test signals have been applied and the corresponding energies have been measured, the model parameters may be adjusted, and the test signal may once again be applied in a sequential fashion and the signal energy in said frequency bands may be measured for each test signal for the adjusted model parameters. This procedure may be iterated as necessary until the model parameters have been adequately tuned.

Figure 16:
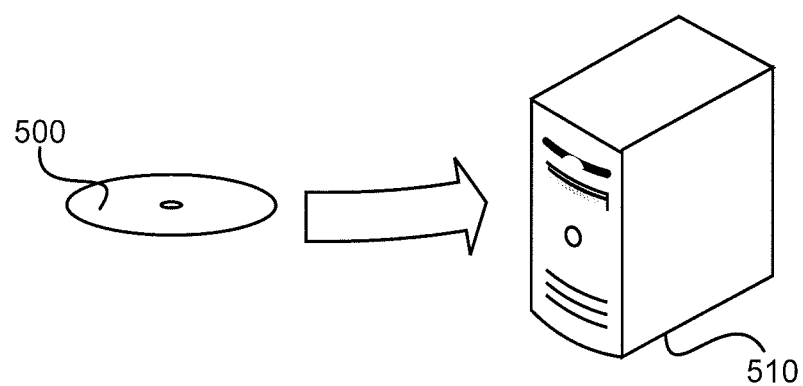
FIG. 16 schematically illustrates a computer-readable medium and a programmable hardware unit.

In some embodiments, the estimation unit 30 (FIGS. 5 and 13), 30*a-c* (FIGS. 1-2) and/or compensation circuit 20 (FIGS. 1-2) may be implemented as dedicated application-specific hardware units. Alternatively, the estimation units 30 and 30*a-c*, compensation circuit 20, and/or parts thereof may be implemented with programmable and/or configurable hardware units, such as but not limited to one or more field-programmable gate arrays (FPGAs), processors, or microcontrollers. Hence, embodiments of the present invention may be embedded in a computer program product, which enables implementation of the method and functions described herein, e.g. the embodiments of the method of compensating nonlinearity errors and of method of estimating nonlinearity errors described above with reference to FIGS. 11 and 12. Therefore, according to embodiments of the present invention, there is provided a computer program product, comprising instructions arranged to cause a programmable hardware unit with processing capabilities, such as the aforementioned one or more processors or micro controllers, to perform the steps of any of the embodiments of said methods. The computer program product may comprise program code which is stored on a computer readable medium 500, as illustrated in FIG. 16, which can be loaded and executed by a programmable hardware unit 510 having processing capabilities, to cause it to perform the steps of any of the embodiments of said methods. The programmable hardware unit 510 having processing capabilities is preferably what normally is referred to as an embedded system. Thus, the depicted programmable hardware unit 510, illustrated in FIG. 13 as a computer, and computer readable medium 500 in FIG. 6 should be construed to be for illustrative purposes only to provide understanding of the principle, and not to be construed as any direct illustration of the elements.

The estimation unit 30 (FIG. 5) or 30*a-c* (FIGS. 1-2), as well as the compensation circuit 20 (FIGS. 1-2) (below referred to with a common term as "electronic unit") may be fabricated by means of computer-aided fabrication. For example, in the case the electronic unit 30, 30*a-c*, 20 or parts thereof is implemented as an application-specific hardware unit in an IC, lithography masks for the fabrication of the electronic unit 30, 30*a-c*, 20 may be fabricated by means of computer-aided fabrication based on hardware-description code describing a physical circuit layout of the electronic unit 30, 30*a-c*, 20, such as but not limited to hardware-description code in the commonly used gdsII file format. Hardware description code describing a physical circuit layout may be computer generated, e.g. by means of synthesis and/or place-and-route computer program tools from another hardware-description code, such as but not limited to hardware-description code on a register-transfer level (RTL), or hardware description code in e.g. VHDL (VHSIC (Very-High-Speed Integrated Circuits) Hardware-Description Language), Verilog, or SystemC, or a combination thereof. Such hardware-description code may also be synthesized for configuring a configurable hardware unit, such as but not limited to an FPGA, to perform the functionality of the electronic unit 30, 30*a-c*, 20. Other hardware-description languages than those listed above exist and the listed languages should not be interpreted as exhaustive or as limiting the invention.

Accordingly, in accordance with embodiments of the present invention, there is provided a hardware-description entity comprising computer-interpretable hardware-description code describing the estimation unit 30, 30*a-c* or the compensation circuit 20 and enabling computer-aided fabrication thereof as an application-specific hardware unit, through configuration of a configurable hardware unit, or a combination thereof.

The hardware-description entity may comprise a file or a set of files comprising the hardware-description code. The file or set of files may e.g. be stored on a computer-readable medium, such as the computer-readable medium 500 (FIG. 16).

In embodiments of the present invention described above, concepts of multirate signal processing have been utilized, such as interpolation, upsampling, downsampling, and polyphase decomposition. Such concepts are well known in the art and are therefore not discussed in further detail herein.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. An estimation unit for estimating a nonlinearity error of a conversion circuit, the conversion circuit being configured to receive a continuous-time input signal and output a digital output signal, wherein the continuous-time input signal is bandlimited to an angular frequency band $[\omega_1, \omega_2]$, where $\omega_1 > (L-1)\pi/T$, $\omega_2 < L\pi/T$, L is a positive integer, and T is a sample period of the conversion circuit, the estimation unit comprising:

an input port configured to receive a digital input signal having a first sample rate 1/T, wherein the digital input signal is an approximation of the continuous-time input signal to the conversion circuit;

an output port configured to output a digital estimated error signal having the first sample rate, wherein the digital estimated error signal is an estimate of the nonlinearity error of the conversion circuit;

a computational branch for each integer P_k in a set of integers, each integer corresponding to a desired model for estimating the nonlinearity error, the computational branch including, a first linear filter unit configured to generate a first signal $s_1(n)$ as a linear function of the digital input signal, wherein n is a first sequence index, an interpolation unit configured to interpolate the first signal $s_1(n)$ to generate a second signal $s_2(m)$ having a second sample rate which is a factor $L \cdot R\_k$ higher than the first sample rate, wherein m is a second sequence index and $R\_k$ is a value selected so that $L \cdot R\_k \geq T \cdot \omega_2 \cdot P\_k / \pi$, a nonlinearity unit configured to generate a third signal $s_3(m)$ as $(s_2(m))^{P\_k}$, and a second linear filter unit configured to generate a component of the estimated error signal based on the third signal $s_3(m)$, wherein said component has the first sample rate; and an adder circuit configured to generate the estimated error signal as a sum of the components of the estimated error signal.

2. The estimation unit according to claim 1, wherein L=1 and the first linear filter unit is configured to receive said digital input signal to generate the first signal $s_1(n)$.

3. The estimation unit according to claim 1, wherein $L \geq 2$ and the estimation unit comprises a high-pass interpolation unit configured to perform high-pass interpolation of the digital input signal with the factor L to generate an interpolated input signal, and wherein the first linear filter unit is configured to receive said interpolated input signal to generate the first signal $s_1(n)$.

4. The estimation unit according to claim 1, wherein the interpolation unit comprises $R\_k$ computational branches, each branch comprising a polyphase component of an interpolation filter of the interpolation unit and configured to generate every $R\_k$:th sample of the second signal $s_2(m)$.

5. The estimation unit according to claim 1, wherein the nonlinearity unit comprises $R\_k$ computational branches, each branch being configured to generate every $R\_k$:th sample of the third signal $s_3(m)$.

6. The estimation unit according to claim 1, wherein the second linear filter unit comprises:

$R\_k$ computational branches, each branch being configured to receive every $R\_k$:th sample of the third signal $s_3(m)$ and comprising a polyphase component of a filter of the second linear filter unit; and an adder circuit configured to generate samples of the component of the estimated error signal as the sum of samples of output signals from the polyphase components of the filter of the second linear filter unit.

7. The estimation unit according to claim 6, wherein $L \geq 2$ and the second linear filter unit further comprises one or more downsampler units configured to downsample at least one of the output signals of the polyphase components and the output signal of the adder circuit with the factor L.

8. A compensation circuit for compensating nonlinearity-errors of a conversion circuit, the conversion circuit being configured to receive a continuous-time input signal and generate a digital output signal, the compensation circuit comprising:

an input port configured to receive the digital output signal from the conversion circuit;

a first subtractor unit configured to subtract a first estimated error signal from the digital output signal of the conversion circuit and thereby generate a first compensated digital output signal; and a first estimation unit including the estimation unit according to claim 1, the first estimation unit being configured to receive the digital output signal from the conversion circuit on an input port of the first estimation unit and generate the first estimated error signal on an output port of the first estimation unit.

9. The compensation circuit according to claim 8, wherein the compensation circuit comprises M additional estimation units, wherein, for $2 \leq i \leq M+1$, the i:th estimation unit is configured to generate an i:th estimated error signal on an output port of the i:th estimation unit;

the compensation circuit comprises an i:th subtractor unit configured to subtract the i:th estimated error signal from the digital output signal of the conversion circuit and thereby generate an i:th compensated digital output signal; and the i:th estimation unit is configured to receive the (i−1):th compensated digital output signal on an input port of the i:th estimation unit.

10. An electronic circuit, comprising:

a conversion circuit configured to receive a continuous-time input signal and generate a digital output signal; and the compensation circuit according to claim 8, wherein the compensation circuit is configured to receive the digital output signal of the conversion circuit on the input port of the compensation circuit.

11. The electronic circuit according to claim 10, wherein the conversion circuit is an analog-to-digital converter.

12. An integrated circuit comprising the compensation circuit according to claim 8.

13. An electronic apparatus comprising the compensation circuit according to claim 8.

14. The electronic apparatus according to claim 13, wherein the electronic apparatus is one of a measurement equipment, a radio receiver, and radar equipment.

15. A method of estimating a nonlinearity error of a conversion circuit configured to receive a continuous-time input signal and output a digital output signal, wherein the continuous-time input signal is bandlimited to an angular frequency band $[\omega_1, \omega_2]$, where $\omega_1 > (L-1)\pi/T$, $\omega_2 < L\pi/T$, L is a positive integer, and T is a sample period of the conversion circuit, the method comprising:

receiving a digital input signal having a first sample rate $1/T$, wherein the digital input signal is an approximation of the continuous-time input signal to the conversion circuit;

for each integer $P\_k$ in a set of integers, each integer corresponding to a desired model for estimating the nonlinearity error, generating a first signal $s_1(n)$ as a linear function of the digital input signal, wherein n is a first sequence index, interpolating the first signal $s_1(n)$ to generate a second signal s2(m) having a second sample rate which is a factor $L \cdot R\_k$ higher than the first sample rate, wherein m is a second sequence index and $R\_k$ is a value selected so that $L \cdot R\_k \geq T \cdot \omega_2 \cdot P\_k / \pi$, generating a third signal $s_3(m)$ as $(s_2(m))^{P\_k}$, and generating a component of an estimated error signal based on linear filtering of the third signal $s_3(m)$, wherein said component has the first sample rate; and generating the estimated error signal as a sum of the components of the estimated error signal.

16. A method of compensating nonlinearity-errors of a conversion circuit configured to receive a continuous-time input signal and generate a digital output signal, the method comprising:

receiving the digital output signal from the conversion circuit;

generating a first estimated error signal according to the method of claim 15 using the digital output signal of the conversion circuit as the digital input signal; and generating a first compensated digital output signal by subtracting the first estimated error signal from the digital output signal of the conversion circuit.

17. The method according to claim 16, further comprising:
generating M additional compensated digital output signals by, for $2 \leq i \leq M+1$;
generating an i:th estimated error signal using the (i−1):th compensated output signal as the digital input signal; and
generating the i:th compensated digital output signal by subtracting the i:th estimated error signal from the digital output signal of the conversion circuit.

18. A non-transitory computer readable medium stored thereon a computer program product comprising computer program code segments for executing the method according to claim 15 when said computer program code segments are run by an electronic device having computer capabilities.

19. A hardware-description entity comprising:
a non-transitory computer readable medium storing computer-interpretable hardware-description code enabling computer-aided fabrication of the estimation unit according to claim 1 as an application-specific hardware unit, through configuration of a configurable hardware unit, or a combination thereof.

20. An electronic circuit, comprising:
a conversion circuit configured to receive a continuous-time input signal and generate a digital output signal; and
the compensation circuit according to claim 9, wherein the compensation circuit is configured to receive the digital output signal of the conversion circuit on its input port.

21. The electronic circuit according to claim 20, wherein the conversion circuit is an analog-to-digital converter.

22. An integrated circuit comprising the compensation circuit according to claim 9.

23. An electronic apparatus comprising the compensation circuit according to claim 9.

24. The electronic apparatus according to claim 23, wherein the electronic apparatus is one of a measurement equipment, a radio receiver, and radar equipment.

25. A hardware-description entity comprising:
a non-transitory computer-readable medium storing computer-interpretable hardware-description code enabling computer-aided fabrication of the compensation circuit according to claim 8 as an application-specific hardware unit, through configuration of a configurable hardware unit, or a combination thereof.

26. The estimation unit of claim 1, wherein the first linear filter unit and the second linear filter unit are configured to use a discrete-time model of the conversion circuit, the model comprising parameters estimated in order for the model to mimic the behavior of the conversion circuit with a desired accuracy.

27. The method of claim 15, wherein the first signal and the second signal are generated using a discrete-time model of the conversion circuit, the model comprising parameters estimated in order for the model to mimic the behavior of the conversion circuit with a desired accuracy.

* * * * *